US010854785B2

(12) United States Patent
Dobrinsky et al.

(10) Patent No.: US 10,854,785 B2
(45) Date of Patent: Dec. 1, 2020

(54) CONTACT CONFIGURATION FOR OPTOELECTRONIC DEVICE

(71) Applicant: Sensor Electronic Technology, Inc., Columbia, SC (US)

(72) Inventors: Alexander Dobrinsky, Silver Spring, MD (US); Maxim S. Shatalov, Columbia, SC (US); Mikhail Gaevski, West Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 38 days.

(21) Appl. No.: 15/798,909

(22) Filed: Oct. 31, 2017

(65) Prior Publication Data

US 2018/0069154 A1 Mar. 8, 2018

Related U.S. Application Data

(63) Continuation-in-part of application No. 15/283,462, filed on Oct. 3, 2016, now Pat. No. 10,147,848.
(Continued)

(51) Int. Cl.
*H01L 29/06* (2006.01)
*H01L 33/40* (2010.01)
(Continued)

(52) U.S. Cl.
CPC ...... *H01L 33/405* (2013.01); *H01L 31/02327* (2013.01); *H01L 31/022408* (2013.01);
(Continued)

(58) Field of Classification Search
CPC ....... H01L 33/387; H01L 33/20; H01L 33/38; H01L 31/035236; H01L 33/32;
(Continued)

(56) References Cited

U.S. PATENT DOCUMENTS 8,969,198 B2 3/2015 Gaevski et al.
9,287,442 B2 3/2016 Shatalov et al.
(Continued)

OTHER PUBLICATIONS

Haider, W., U.S. Appl. No. 15/283,462, Notice of Allowance, dated Jul. 13, 2018, 8 pages.
(Continued)

*Primary Examiner* — Stephen M Bradley
*Assistant Examiner* — Wasiul Haider
(74) *Attorney, Agent, or Firm* — LaBatt, LLC

(57) ABSTRACT

An optoelectronic device with a multi-layer contact is described. The optoelectronic device can include an n-type semiconductor layer having a surface. A mesa can be located over a first portion of the surface of the n-type semiconductor layer and have a mesa boundary. An n-type contact region can be located over a second portion of the surface of the n-type semiconductor contact layer entirely distinct from the first portion, and be at least partially defined by the mesa boundary. A first n-type metallic contact layer can be located over at least a portion of the n-type contact region in proximity of the mesa boundary, where the first n-type metallic contact layer forms an ohmic contact with the n-type semiconductor layer. A second metallic contact layer can be located over a second portion of the n-type contact region, where the second metallic contact layer is formed of a reflective metallic material.

19 Claims, 14 Drawing Sheets

Related U.S. Application Data

(60) Provisional application No. 62/415,479, filed on Oct. 31, 2016, provisional application No. 62/236,045, filed on Oct. 1, 2015.

(51) Int. Cl.
| | |
|---|---|
| *H01L 33/20* | (2010.01) |
| *H01L 33/44* | (2010.01) |
| *H01L 33/02* | (2010.01) |
| *H01L 33/32* | (2010.01) |
| *H01L 33/12* | (2010.01) |
| *H01L 33/00* | (2010.01) |
| *H01L 31/0224* | (2006.01) |
| *H01L 31/0304* | (2006.01) |
| *H01L 31/18* | (2006.01) |
| *H01L 33/38* | (2010.01) |
| *H01L 31/0232* | (2014.01) |
| *H01L 33/46* | (2010.01) |

(52) U.S. Cl.
CPC .... *H01L 31/03048* (2013.01); *H01L 31/1848* (2013.01); *H01L 31/1852* (2013.01); *H01L 33/007* (2013.01); *H01L 33/0075* (2013.01); *H01L 33/025* (2013.01); *H01L 33/12* (2013.01); *H01L 33/20* (2013.01); *H01L 33/32* (2013.01); *H01L 33/38* (2013.01); *H01L 33/387* (2013.01); *H01L 33/44* (2013.01); *H01L 33/46* (2013.01); *H01L 2933/0016* (2013.01); *H01L 2933/0091* (2013.01)

(58) Field of Classification Search
CPC . H01L 33/12; H01L 31/1852; H01L 31/1848; H01L 33/007; H01L 31/0392; H01L 33/405; H01L 31/03048; H01L 31/109; H01L 31/02327
See application file for complete search history.

(56) References Cited

U.S. PATENT DOCUMENTS

| | | | |
|---|---|---|---|
| 9,312,448 | B2 | 4/2016 | Lunev et al. |
| 10,147,848 | B2 | 12/2018 | Gaevski et al. |
| 2006/0231852 | A1 | 10/2006 | Kususe et al. |
| 2010/0012969 | A1 | 1/2010 | Yoon et al. |
| 2012/0161196 | A1 | 6/2012 | Lowenthal et al. |
| 2012/0319223 | A1 | 12/2012 | Welser et al. |
| 2013/0260490 | A1 | 10/2013 | Shatalov et al. |
| 2013/0292722 | A1 | 11/2013 | Chen et al. |
| 2014/0070165 | A1* | 3/2014 | Park ............ H01L 21/02458 257/13 |
| 2014/0191261 | A1 | 7/2014 | Shatalov et al. |
| 2015/0160072 | A1 | 6/2015 | Yan et al. |
| 2015/0179751 | A1 | 6/2015 | Gaevski et al. |
| 2015/0228855 | A1 | 8/2015 | Shatalov et al. |
| 2015/0270442 | A1 | 9/2015 | Chae et al. |
| 2016/0049551 | A1 | 2/2016 | Shatalov et al. |
| 2016/0149075 | A1 | 5/2016 | Atanackovic |
| 2017/0098739 | A1 | 4/2017 | Gaevski et al. |
| 2017/0148930 | A1* | 5/2017 | Zhu ............... H01L 31/02363 |
| 2018/0323345 | A1 | 11/2018 | Dobrinsky et al. |

OTHER PUBLICATIONS

Haider, W., U.S. Appl. No. 15/283,462, Office Action1, dated Dec. 15, 2017, 23 pages.

Yan, X., et al., "Asymmetric Backscattering of Ultraviolet Light by Low-Refractive Index Thin Film of Tilted Alumina Nanorods," CLEO: Applications and Technology, 2013, 2 pages.

Yan, X., et al., "Deep-ultraviolet tailored- and low-refractive index antireflection coatings for light-extraction enhancement of light emitting diodes," Journal of Applied Physics, 2013, 7 pages.

Haider, W., U.S. Appl. No. 16/025,186, Notice of Allowance, dated Mar. 5, 2020, 10 pages.

\* cited by examiner

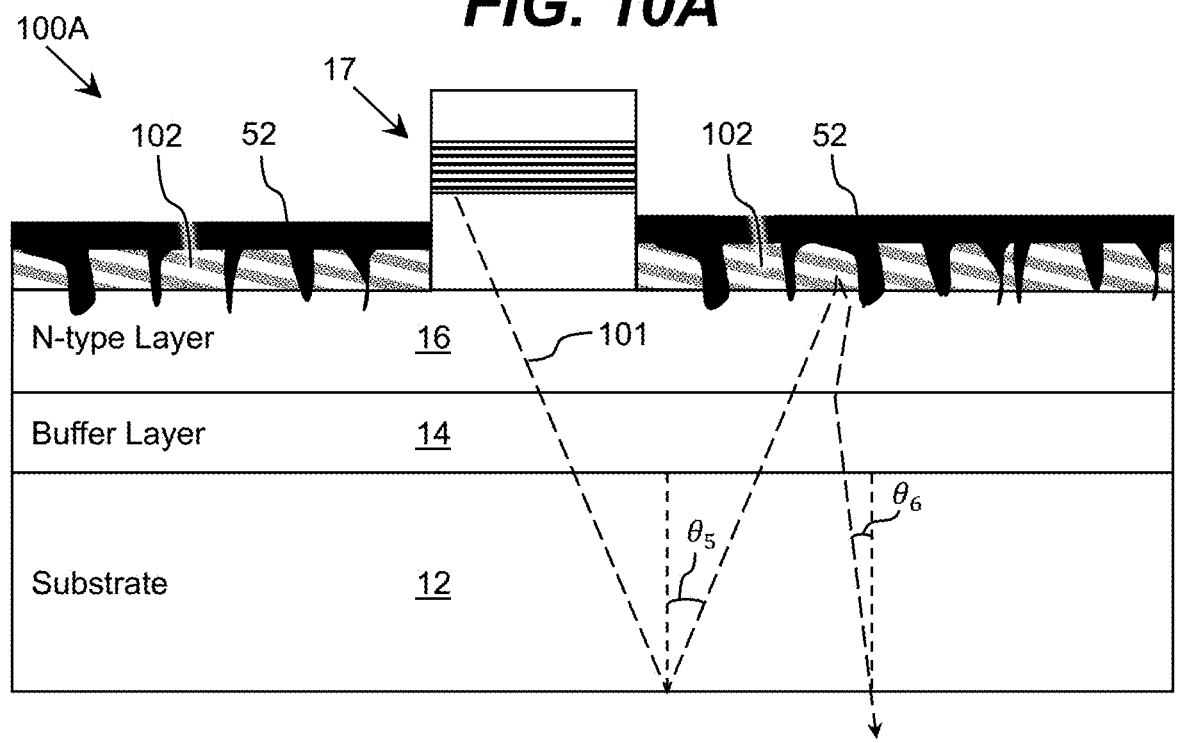
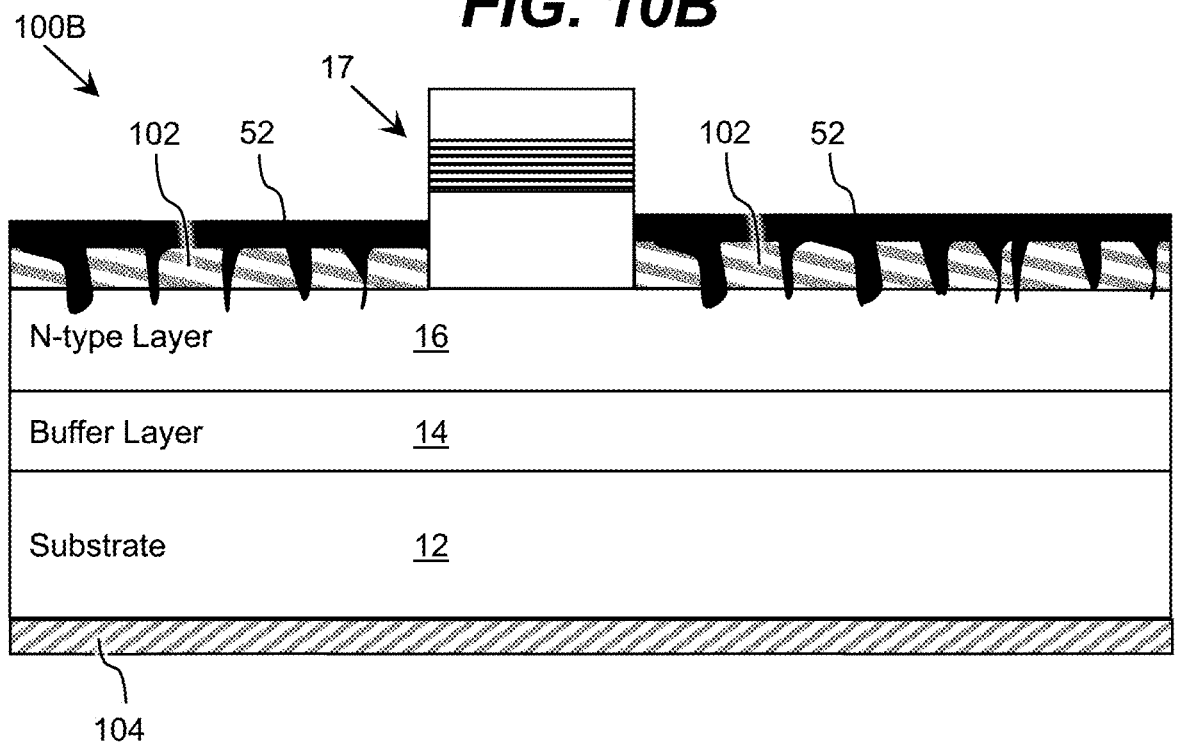

CONTACT CONFIGURATION FOR OPTOELECTRONIC DEVICE

REFERENCE TO RELATED APPLICATIONS

The current application claims the benefit of U.S. Provisional Application No. 62/415,479, filed 31 Oct. 2016, and is a continuation-in-part of U.S. patent application Ser. No. 15/283,462, filed 3 Oct. 2016, which claims the benefit of U.S. Provisional Application No. 62/236,045, filed on 1 Oct. 2015, all of which are hereby incorporated by reference.

TECHNICAL FIELD

The disclosure relates generally to emitting devices, and more particularly, to an optoelectronic device having a contact configuration, which can provide, for example, decreased light absorption and/or improved light extraction.

BACKGROUND ART

Semiconductor emitting devices, such as light emitting diodes (LEDs) and laser diodes (LDs), include solid state emitting devices composed of group III-V semiconductors. A subset of group III-V semiconductors includes group III nitride alloys, which can include binary, ternary and quaternary alloys of indium (In), aluminum (Al), gallium (Ga), and nitrogen (N). Illustrative group III nitride-based LEDs and LDs can be of the form $In_yAl_xGa_{1-x-y}N$, where x and y indicate the molar fraction of a given element, $0 \leq x$, $y \leq 1$, and $0 \leq x+y \leq 1$. Other illustrative group III nitride based LEDs and LDs are based on boron (B) nitride (BN) and can be of the form $Ga_zIn_yAl_xB_{1-x-y-z}N$, where $0 \leq x$, y, $z \leq 1$, and $0 \leq x+y+z \leq 1$.

An LED is typically composed of semiconducting layers. During operation of the LED, an applied bias across doped layers leads to injection of electrons and holes into an active layer where electron-hole recombination leads to light generation. Light is generated with uniform angular distribution and escapes the LED die by traversing semiconductor layers in all directions. Each semiconducting layer has a particular combination of molar fractions (e.g., x, y, and z) for the various elements, which influences the optical properties of the layer. In particular, the refractive index and absorption characteristics of a layer are sensitive to the molar fractions of the semiconductor alloy.

An interface between two layers is defined as a semiconductor heterojunction. At an interface, the combination of molar fractions is assumed to change by a discrete amount. A layer in which the combination of molar fractions changes continuously is said to be graded. Changes in molar fractions of semiconductor alloys can allow for band gap control, but can lead to abrupt changes in the optical properties of the materials and result in light trapping. A larger change in the index of refraction between the layers, and between the substrate and its surroundings, results in a smaller total internal reflection (TIR) angle (provided that light travels from a high refractive index material to a material with a lower refractive index). A small TIR angle results in a large fraction of light rays reflecting from the interface boundaries, thereby leading to light trapping and subsequent absorption by layers or LED metal contacts.

Roughness at an interface allows for partial alleviation of the light trapping by providing additional surfaces through which light can escape without totally internally reflecting from the interface. Nevertheless, light only can be partially transmitted through the interface, even if it does not undergo TIR, due to Fresnel losses. Fresnel losses are associated with light partially reflected at the interface for all the incident light angles. Optical properties of the materials on each side of the interface determines the magnitude of Fresnel losses, which can be a significant fraction of the transmitted light.

SUMMARY OF THE INVENTION

Aspects of the invention provide an optoelectronic device with a multi-layer contact. The optoelectronic device can include an n-type semiconductor layer having a surface. A mesa can be located over a first portion of the surface of the n-type semiconductor layer and have a mesa boundary. An n-type contact region can be located over a second portion of the surface of the n-type semiconductor contact layer entirely distinct from the first portion, and be at least partially defined by the mesa boundary. A first n-type metallic contact layer can be located over at least a portion of the n-type contact region in proximity of the mesa boundary, where the first n-type metallic contact layer forms an ohmic contact with the n-type semiconductor layer. A second metallic contact layer can be located over a second portion of the n-type contact region, where the second metallic contact layer is formed of a reflective metallic material.

A first aspect of the invention provides an optoelectronic device comprising: an n-type semiconductor layer having a surface; a mesa located over a first portion of the surface of the n-type semiconductor layer and having a mesa boundary; an n-type contact region located over a second portion of the surface of the n-type semiconductor contact layer entirely distinct from the first portion, wherein the n-type contact region is at least partially defined by the mesa boundary; a first n-type metallic contact layer located over at least a portion of the n-type contact region in proximity of the mesa boundary, wherein the first n-type metallic contact layer forms an ohmic contact with the n-type semiconductor layer; and a second metallic contact layer located over a second portion of the n-type contact region, wherein the second metallic contact layer is formed of a reflective metallic material.

A second aspect of the invention provides an optoelectronic device comprising: an n-type group III nitride semiconductor layer having a surface; a mesa located over a first portion of the surface of the n-type group III nitride semiconductor layer and having a mesa boundary, wherein the mesa boundary includes a plurality of interconnected fingers; an n-type contact region located over a second portion of the surface of the n-type group III nitride semiconductor contact layer entirely distinct from the first portion, wherein the n-type contact region is at least partially defined by the mesa boundary; a first n-type metallic contact layer located over at least a portion of the n-type contact region in proximity of the mesa boundary, wherein the first n-type metallic contact layer forms an ohmic contact with the n-type group III nitride semiconductor layer, and wherein the first n-type metallic contact layer extends between the plurality of interconnected fingers; and a second metallic contact layer located over a second portion of the n-type contact region, wherein the second metallic contact layer is formed of a reflective metallic material.

A third aspect of the invention provides a method of fabricating an optoelectronic device comprising: forming a mesa having a mesa boundary over a first portion of an n-type semiconductor layer, wherein the mesa includes an active semiconductor layer and a p-type semiconductor contact layer located on an opposite side of the active semiconductor layer as the n-type semiconductor layer, and wherein the n-type semiconductor layer has an n-type contact region located over a second portion of the surface of the n-type semiconductor contact layer entirely distinct from the first portion, wherein the n-type contact region is at least partially defined by the mesa boundary; depositing a first n-type metallic contact layer over a first portion of the n-type contact region in proximity to the mesa boundary; and depositing a second metallic contact layer over a second portion of the n-type contact region.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 10A-10D show cross sections of illustrative optoelectronic devices according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
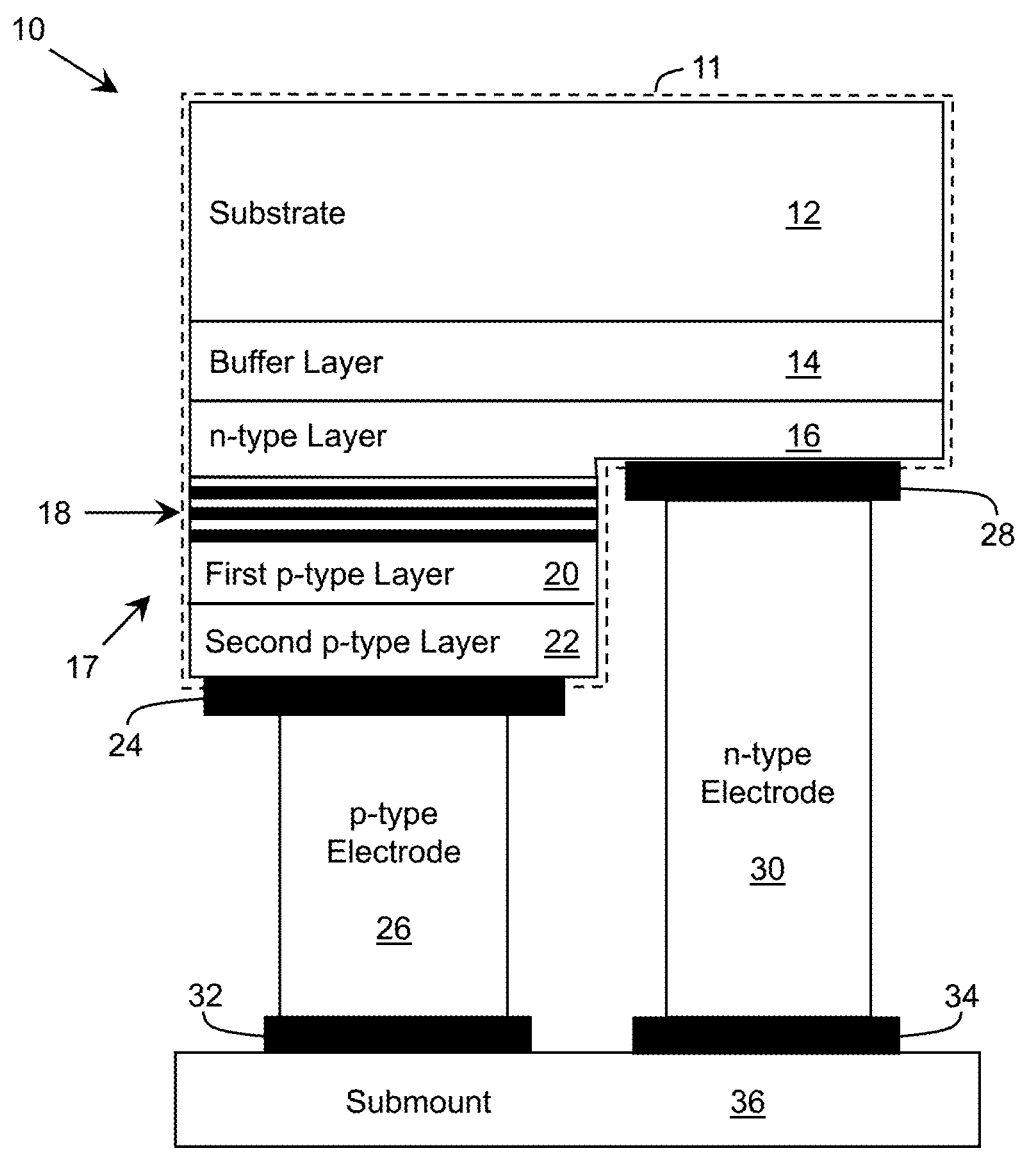
FIG. 1 shows a schematic structure of an illustrative optoelectronic device according to an embodiment.

As indicated above, aspects of the invention provide an optoelectronic device with a multi-layer contact. The optoelectronic device can include an n-type semiconductor layer having a surface. A mesa can be located over a first portion of the surface of the n-type semiconductor layer and have a mesa boundary. An n-type contact region can be located over a second portion of the surface of the n-type semiconductor contact layer entirely distinct from the first portion, and be at least partially defined by the mesa boundary. A first n-type metallic contact layer can be located over at least a portion of the n-type contact region in proximity of the mesa boundary, where the first n-type metallic contact layer forms an ohmic contact with the n-type semiconductor layer. A second metallic contact layer can be located over a second portion of the n-type contact region, where the second metallic contact layer is formed of a reflective metallic material. The optoelectronic device can have improved light emission. To this extent, embodiments of the optoelectronic device include: a light emitting diode (LED), an ultraviolet (UV) LED, a photodiode, and a laser diode.

As used herein, unless otherwise noted, the term "set" means one or more (i.e., at least one) and the phrase "any solution" means any now known or later developed solution. It is understood that, unless otherwise specified, each value is approximate and each range of values included herein is inclusive of the end values defining the range. As used herein, unless otherwise noted, the term "approximately" is inclusive of values within +/−ten percent of the stated value, while the term "substantially" is inclusive of values within +/−five percent of the stated value. Unless otherwise stated, two values are "similar" when the smaller value is within +/−twenty-five percent of the larger value. A value, y, is on the order of a stated value, x, when the value y satisfies the formula $0.1x \leq y \leq 10x$.

As also used herein, a layer is a transparent layer when the layer allows at least ten percent of radiation having a target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength +/−five nanometers) by an active region of an optoelectronic device during operation of the device. For a given layer, the wavelength can be measured in a material of consideration and can depend on a refractive index of the material. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/−one percent).

Turning to the drawings, FIG. 1 shows a schematic structure of an illustrative optoelectronic device 10 according to an embodiment. In a more particular embodiment, the optoelectronic device 10 is configured to operate as an emitting device, such as a light emitting diode (LED) or a laser diode (LD). In either case, during operation of the emitting device, application of a bias comparable to the band gap results in the emission of electromagnetic radiation from an active region 18 of the emitting device. Alternatively, the optoelectronic device 10 can operate as a sensing device, such as a photodiode. The electromagnetic radiation emitted or sensed by the optoelectronic device 10 can comprise a peak wavelength within any range of wavelengths, including visible light, ultraviolet radiation, deep ultraviolet radiation, infrared light, and/or the like. In an embodiment, the optoelectronic device 10 is configured to emit (or sense) radiation having a dominant wavelength within the ultraviolet range of wavelengths. In a more specific embodiment, the dominant wavelength is within a range of wavelengths between approximately 210 and approximately 360 nanometers.

The optoelectronic device 10 includes a heterostructure 11 comprising a substrate 12, a buffer layer 14 adjacent to the substrate 12, an n-type layer 16 (e.g., a cladding layer, electron supply layer, contact layer, and/or the like) adjacent to the buffer layer 14, and a mesa 17 located adjacent to a portion of the n-type layer 16. The mesa 17 can include an active region 18 having an n-type side adjacent to the n-type layer 16. Furthermore, the heterostructure 11 of the optoelectronic device 10 includes a first p-type layer 20 (e.g., an electron blocking layer, a cladding layer, hole supply layer, and/or the like) adjacent to a p-type side of the active region 18 and a second p-type layer 22 (e.g., a cladding layer, hole supply layer, contact layer, and/or the like) adjacent to the first p-type layer 20.

In a more particular illustrative embodiment, the optoelectronic device 10 is a group III-V materials based device, in which some or all of the various layers are formed of elements selected from the group III-V materials system. In a still more particular illustrative embodiment, the various layers of the optoelectronic device 10 are formed of group III nitride based materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based optoelectronic device 10 includes an active region 18 (e.g., a series of alternating quantum wells and barriers) composed of $In_y Al_x Ga_{1-x-y} N$, $Ga_z In_y Al_x B_{1-x-y-z} N$, an $Al_x Ga_{1-x} N$ semiconductor alloy, or the like. Similarly, the n-type layer 16, the first p-type layer 20, and the second p-type layer 22 can be composed of an $In_y Al_x Ga_{1-x-y} N$ alloy, a $Ga_z In_y Al_x B_{1-x-y-z} N$ alloy, or the like. The molar fractions given by x, y, and z can vary between the various layers 16, 18, 20, and 22. When the optoelectronic device 10 is configured to be operated in a flip chip configuration, such as shown in FIG. 1, the substrate 12 and buffer layer 14 can be transparent to the target electromagnetic radiation. To this extent, an embodiment of the substrate 12 can be formed of sapphire, and the buffer layer 14 can be composed of AlN, an AlGaN/AlN superlattice, and/or the like. However, it is understood that the substrate 12 can be formed of any suitable material including, for example, silicon carbide (SiC), silicon (Si), bulk GaN, bulk AlN, bulk or a film of AlGaN, bulk or a film of BN, AlON, LiGaO$_2$, LiAlO$_2$, aluminum oxinitride (AlO$_x$N$_y$), MgAl$_2$O$_4$, GaAs, Ge, or another suitable material. Furthermore, a surface of the substrate 12 can be substantially flat or patterned using any solution.

The optoelectronic device 10 can further include a p-type contact 24, which can form an ohmic contact to the second p-type layer 22, and a p-type electrode 26 can be attached to the p-type contact 24. Similarly, the optoelectronic device 10 can include an n-type contact 28, which can form an ohmic contact to the n-type layer 16, and an n-type electrode 30 can be attached to the n-type contact 28. Each contact 24, 28 can be formed of a metal.

In an embodiment, the p-type contact 24 and the n-type contact 28 each comprise several conductive and reflective metal layers, while the n-type electrode 30 and the p-type electrode 26 each comprise highly conductive metal. In an embodiment, the second p-type layer 22 and/or the p-type electrode 26 can be transparent to the electromagnetic radiation generated by the active region 18. For example, the second p-type layer 22 and/or the p-type electrode 26 can comprise a short period superlattice lattice structure, such as an at least partially transparent magnesium (Mg)-doped AlGaN/AlGaN short period superlattice structure (SPSL). Furthermore, the p-type electrode 26 and/or the n-type electrode 30 can be reflective of the electromagnetic radiation generated by the active region 18. In another embodiment, the n-type layer 16 and/or the n-type electrode 30 can be formed of a short period superlattice, such as an AlGaN SPSL, which is transparent to the electromagnetic radiation generated by the active region 18.

As further shown with respect to the optoelectronic device 10, the device 10 can be mounted to a submount 36 via the electrodes 26, 30 in a flip chip configuration. In this case, the substrate 12 is located on the top of the optoelectronic device 10. To this extent, the p-type electrode 26 and the n-type electrode 30 can both be attached to a submount 36 via contact pads 32, 34, respectively. The submount 36 can be formed of aluminum nitride (AlN), silicon carbide (SiC), and/or the like.

Any of the various layers of the heterostructure 11 can comprise a substantially uniform composition or a graded composition. For example, a layer can comprise a graded composition at a heterointerface with another layer. In an embodiment, the first p-type layer 20 comprises a p-type blocking layer (e.g., electron blocking layer) having a graded composition. The graded composition(s) can be included to, for example, reduce stress, improve carrier injection, and/or the like. Similarly, any of the various layers of the heterostructure 11 can comprise a superlattice including a plurality of periods, which can be configured to reduce stress, and/or the like. In this case, the composition and/or width of each period can vary periodically or aperiodically from period to period.

It is understood that the layer configuration of the heterostructure 11 described herein is only illustrative. To this extent, a heterostructure for an optoelectronic device described herein can include an alternative layer configuration, one or more additional layers, one or more fewer layers, and/or the like. As a result, while the various layers are shown immediately adjacent to one another (e.g., contacting one another), it is understood that one or more intermediate layers can be present in a heterostructure. For example, an illustrative heterostructure can include an undoped layer located between the active region 18 and one or both of the first p-type layer 20 and the n-type layer 16.

Figure 2A:
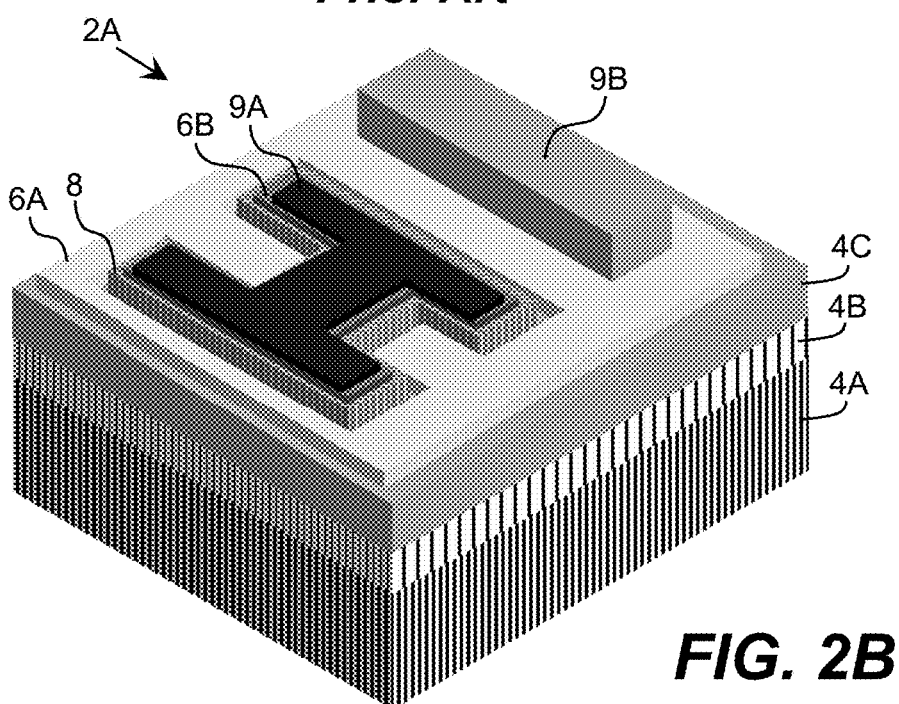
FIGS. 2A and 2B show top isometric views of illustrative optoelectronic devices according to the prior art.
Figure 2B:
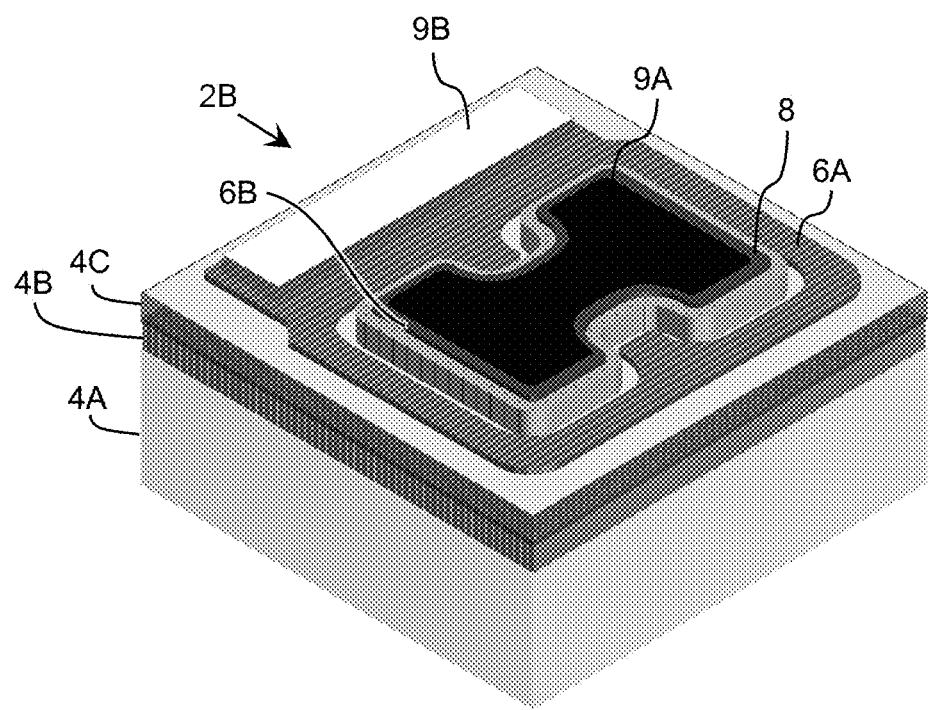

FIGS. 2A and 2B show top isometric views of illustrative optoelectronic devices 2A, 2B according to the prior art. Each device 2A, 2B has a heterostructure including an n-type contact layer 4C epitaxially grown over a buffer layer 4B with the buffer layer 4B deposited over a substrate 4A. An n-type metallic contact layer 6A is shown deposited over a portion of a surface of the n-type contact layer 4C. A mesa 8 is epitaxially grown over another portion of the surface of the n-type contact layer 4C and is separated from the metallic contact layer 6A by a small gap of few nanometers. The mesa 8 can include an active region and a set of p-type semiconductor layers, with a p-type metallic contact layer 6B located thereon. In this configuration, the mesa has a set of sides forming a mesa boundary, which defines a lateral extent and shape of the mesa 8. For the semiconductor heterostructure to operate as an optoelectronic device, the heterostructure is connected to positive and negative bias using electrodes 9A and 9B, respectively. The n-type metallic contact layer 6A can comprise any typical metal used for fabrication of ohmic n-type contact to the semiconductor. For example, the n-type metallic contact layer 6A can contain titanium, aluminum, and/or chromium. The n-type metallic contact layer 6A as well as n-type semiconductor contact layer 4C can be light absorbing, especially for light emitting devices operating at the ultraviolet wavelengths, which can be detrimental to the efficiency of the device.

Figure 3A:
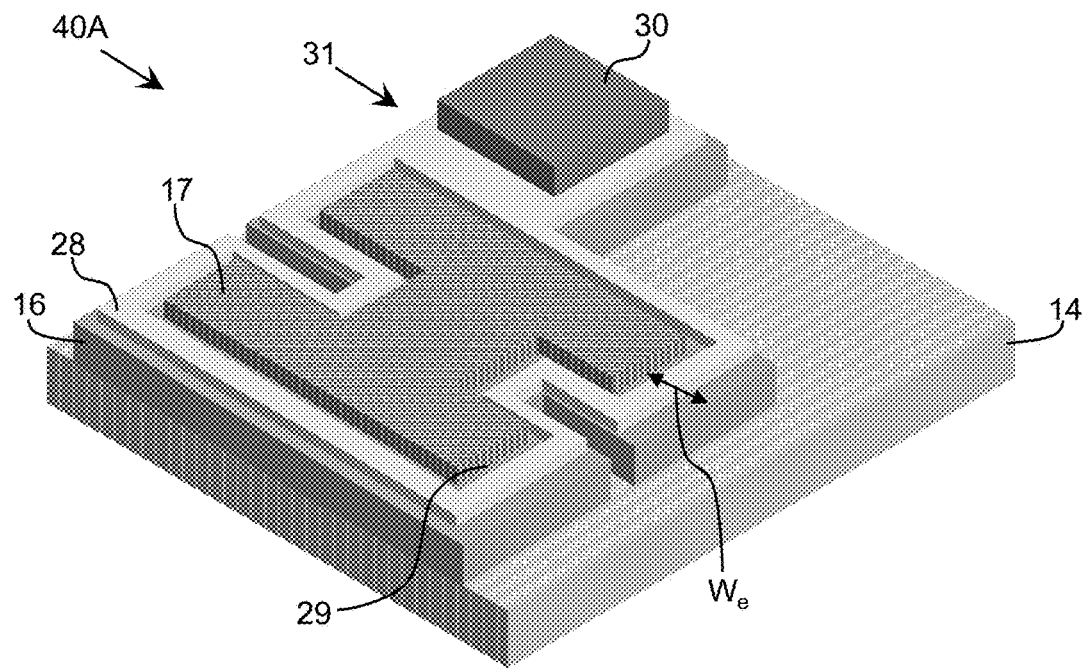
FIGS. 3A and 3B show top isometric views of illustrative optoelectronic devices according to embodiments.
Figure 3B:
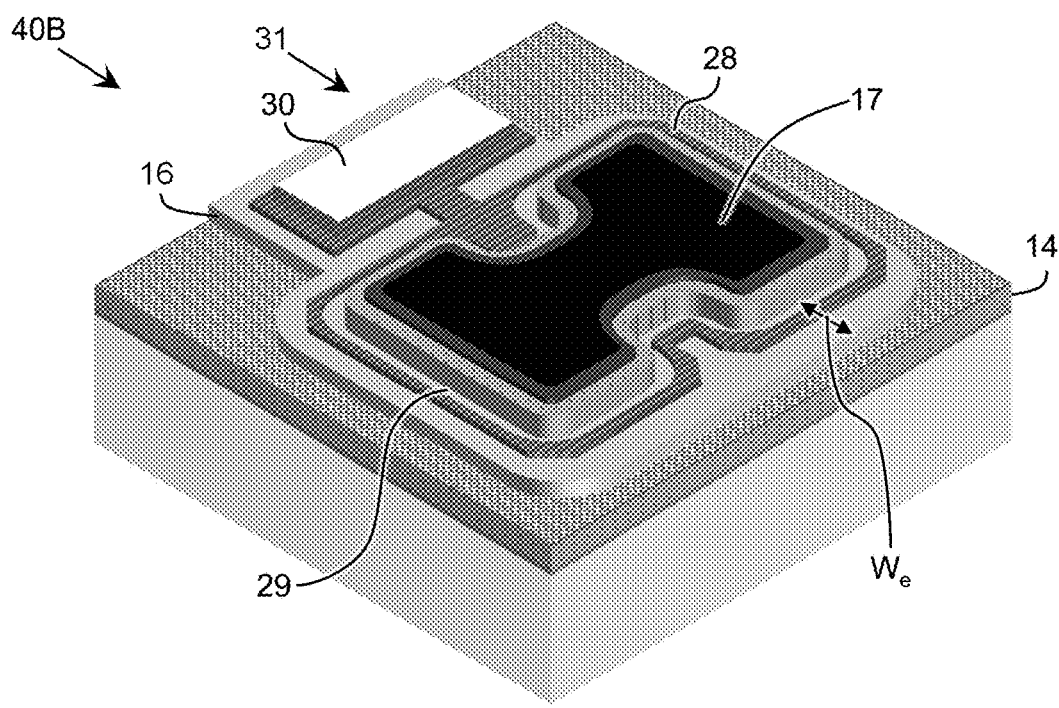

FIGS. 3A and 3B show top isometric views of illustrative optoelectronic devices 40A, 40B according to embodiments of the current invention. In each case, the n-type layer 16 (e.g., an n-type cladding layer, an n-type contact layer, and/or the like) and the n-type metallic contact 28 have a shape corresponding to the shape of the mesa 17, which can include the active region (e.g., a light generating or light detecting structure having a set of quantum wells and barriers) and/or one or more p-type semiconductor layers as described herein. In an embodiment, the n-type layer 16 and the n-type metallic contact 28 can be etched to at least a surface of the buffer layer 14. The shape of the n-type layer 16 and the n-type metallic contact 28 can be configured to reduce radiation losses associated with the n-type layer 16 and the n-type metallic contact 28. The n-type layer 16 and the n-type metallic contact 28 can further include a region on which the electrode 28 can be formed.

The n-type layer 16 and the buffer layer 14 can comprise group III nitride materials that are transparent to the target radiation. In an embodiment, for a target radiation in the ultraviolet range, the n-type layer 16 can comprise a $Al_xGa_{1-x}N$ layer with the molar fraction x being in the range of 0.3 to 0.7. In an embodiment, the buffer layer 14 can comprise AlN. In yet another embodiment, either optoelectronic device 40A, 40B can have a target wavelength in the range of 270-320 nm. The width of the n-type layer 16 can exceed a width of the mesa 17 by an excess width $W_e$, which can be defined as the largest distance from the contact boundary (which corresponds to the boundary of the mesa 17) to n-type layer 16 outer edge when measured along a direction normal to the contact boundary. However, as shown in conjunction with the device 40B, the excess width measurement can ignore regions of the n-type layer 16 that exceed a typical excess width $W_e$ due to the limits of fabrication. For example, the excess width $W_e$ of the n-type layer 16 can be at least the current spreading length as measured in the n-type layer 16 at the device operating temperature. The current spreading length can be approximated by $L=\sqrt{(\rho_c+\rho_p t_p)t_n/\rho_n}$ where $t_p$ is the thickness of the p-type layer, $t_n$ is the thickness of the n-type layer, $\rho_p$ and $\rho_n$ are the resistivities of the p-type and n-type layers respectively, and $\rho_c$ is a specific contact resistivity of the p-type ohmic contact. Using this formula with typical numbers for group III nitride p-type and n-type semiconductor layers: $\rho_c \sim 5.\times 10^{-3}$ $\Omega cm^2$, $\rho_p \sim 100$ $\Omega cm^2$, $\rho_n \sim 0.1$ $\Omega cm^2$, $t_p \sim 100$ nm, $t_n \sim 1$ µm, the current spreading length is about 25 µm. In general, depending on the particular semiconductor structure, the spreading length can be estimated as between approximately 10 µm and approximately 80 µm. FIGS. 3A and 3B show the n-type metallic contact 28 having a comparable excess width and also enclosing the mesa 17.

It is understood that the n-type layer 16 can be defined as a domain having a boundary or a set of boundaries where each boundary comprises a connected curve. As used herein, a smallest characteristic length-scale of the n-type metallic contact 28 means: for every point at all the boundaries (and for engineering accuracy, the boundary can be discretized by a set of points) of the n-type contact region, measure a distance along the negative normal direction (positive normal direction points outside of the domain) to the boundary until intersection with any other boundary point. The shortest such distance is defined as a smallest characteristic length-scale of the n-type contact. Please note, that according to such definition, the excess width $W_e$ corresponds to the smallest characteristic length-scale of the n-type contact.

In an embodiment, the n-type layer 16 can comprise a layer with an excess width greater than the current spreading length, and in an embodiment can comprise an excess width of several current spreading lengths. In an embodiment, the n-type layer 16 covers a portion of the buffer layer 14, leaving some of the surface of the buffer layer 14 exposed. In an embodiment, the n-type layer 16 can have a top surface area for an n-type contact region that is at least 5% smaller than a surface area of a top surface of the buffer layer 14. For reliable operation of the device 40, the exposed surface of the buffer layer 14 can be protected with a dielectric layer. The dielectric layer can comprise any suitable insulating material, including for example, $SiO_2$, anodized aluminum oxide (AAO), $CaF_2$, $MgF_2$, and/or the like.

It is understood that the further buffer etching in regions not covered by any of the epitaxial layers can be employed resulting in some substrate 12 (FIG. 1) areas being uncovered by semiconductor layers. In an embodiment a buffer layer 14 is etched such that the top surface of the buffer layer is at least 5% smaller than a surface area of the top surface of the substrate. The exposed substrate area(s) also can be protected with any suitable dielectric layer including for example, $SiO_2$, AAO, $CaF_2$, $MgF_2$, and/or the like. In an alternative embodiment, the substrate 12 can be protected with a reflective metallic layer such as aluminum, rhodium or/and the like. In yet another embodiment, the substrate 12 can be protected by a multilayered film comprising an omnidirectional mirror wherein the layers adjacent to substrate can comprise the dielectric layers described herein followed by the reflective metallic layers. The n-type metallic contact 28 comprises a shape forming a pad area 31 that can be contacted by the n-type electrode 30, comprising conductive metals. In an embodiment, the pad area 31 has a size less than one half of a lateral length of an adjacent side of the mesa 17.

In an embodiment, an optoelectronic device described herein comprises an n-type semiconductor layer 16 having a surface comprising a mesa region 17 covering either one or several areas of the surface, with at least some of the other areas of the surface covered by an n-type metallic contact 28. The area(s) covered by the n-type metallic contact 28 can be defined as an n-type surface. The mesa(s) 17 and the n-type metallic contact 28 are separated by a gap 29, which can be defined by a set of contact boundaries or a boundary between a mesa region and the n-type metallic contact layer.

Figure 4A:
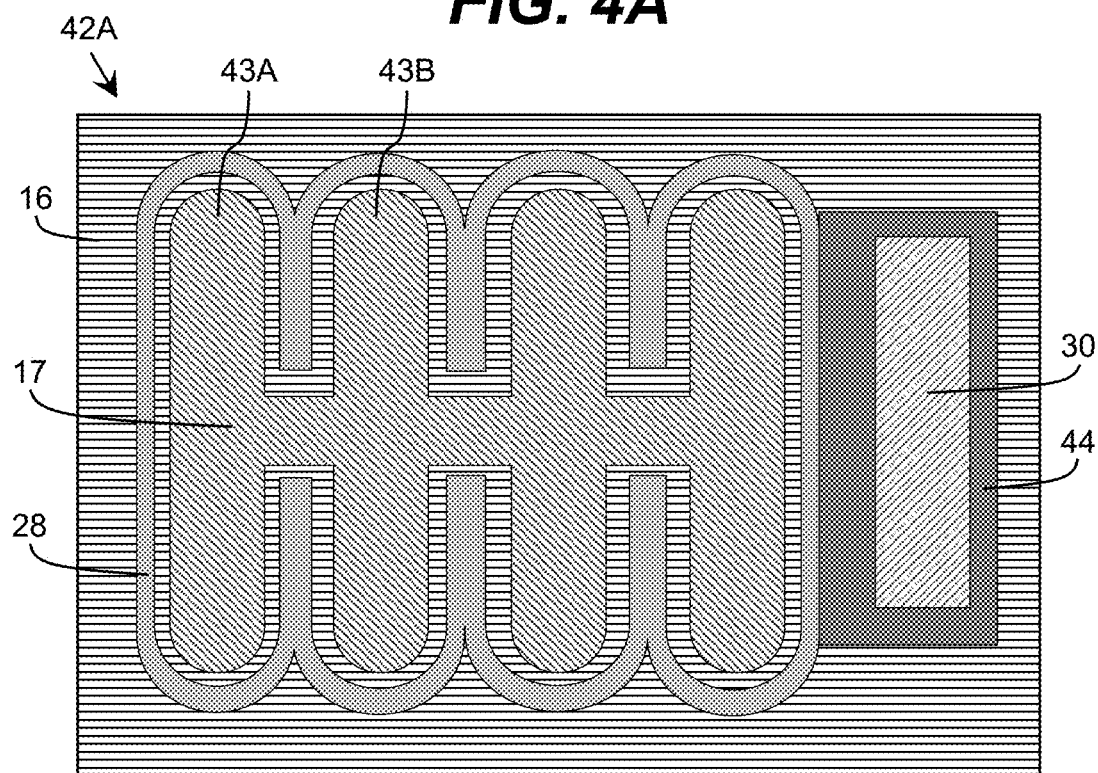
FIGS. 4A and 4B show illustrative devices including an interdigitated mesa and n-type contact according to embodiments.
Figure 4B:
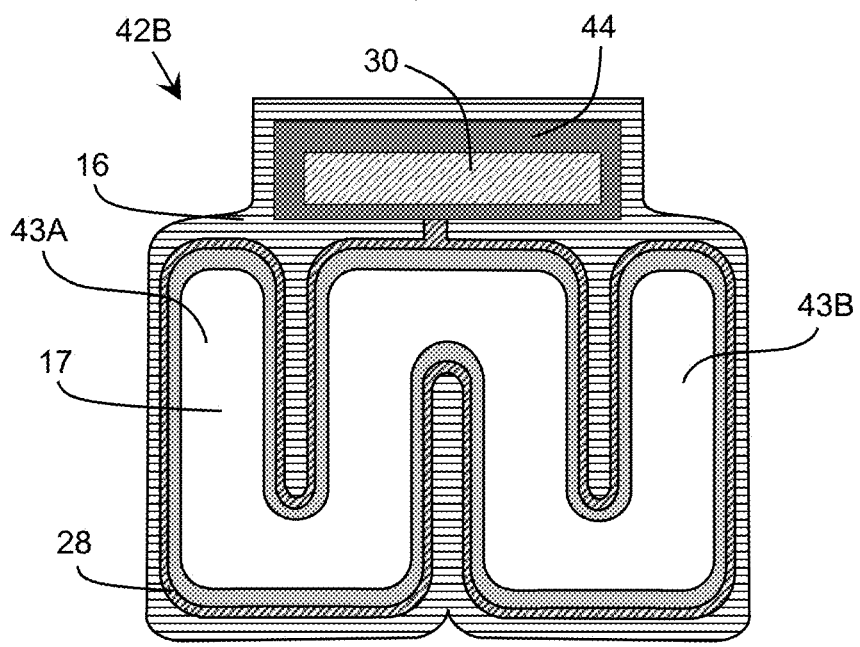

It is understood that the shapes of the devices 40A, 40B shown in FIGS. 3A and 3B are only illustrative of various possible configurations for a device described herein. To this extent, top views of other illustrative optoelectronic devices 42A, 42B are shown in FIGS. 4A and 4B, respectively. In each case, the device 42A, 42B comprises a complex interdigitated n-type metallic contact 28 being in proximity of a mesa 17 having a complex form including multiple interconnected fingers 43A, 43B. The shape of the mesa 17 and the n-type metallic contact 28 can be selected to, for example, minimize current crowding in the device 42A, 42B. For example, as shown in FIG. 4A, the device 42A has a mesa 17 with fingers 43A, 43B connected in a central region, while the device 42B of FIG. 4B has a mesa 17 with fingers 43A, 43B connected in alternating outer regions thereof to create a serpentine mesa shape. The n-type metallic contact 28 is contacted by an electrode pad 44, on which an electrode 30 is formed. The electrode pad 44 can comprise an ohmic or a reflective metallic electrode and can contact a side surface of the n-type metallic contact 28 and/or extend over a portion of the n-type metallic contact 28. In an embodiment, the metallic electrode can comprise a Ti/Al or Ti/Al/Au metallic contact layer. As illustrated, the electrode 30 can be oriented substantially parallel with a finger as shown in conjunction with the device 42A, or oriented substantially parallel with a connector between fingers as shown in conjunction with the device 42B. Similar to the embodiment shown in FIGS. 3A and 3B, the n-type layer 16 can be partially etched and closely follows the shape of the mesa 17.

Figure 5A:
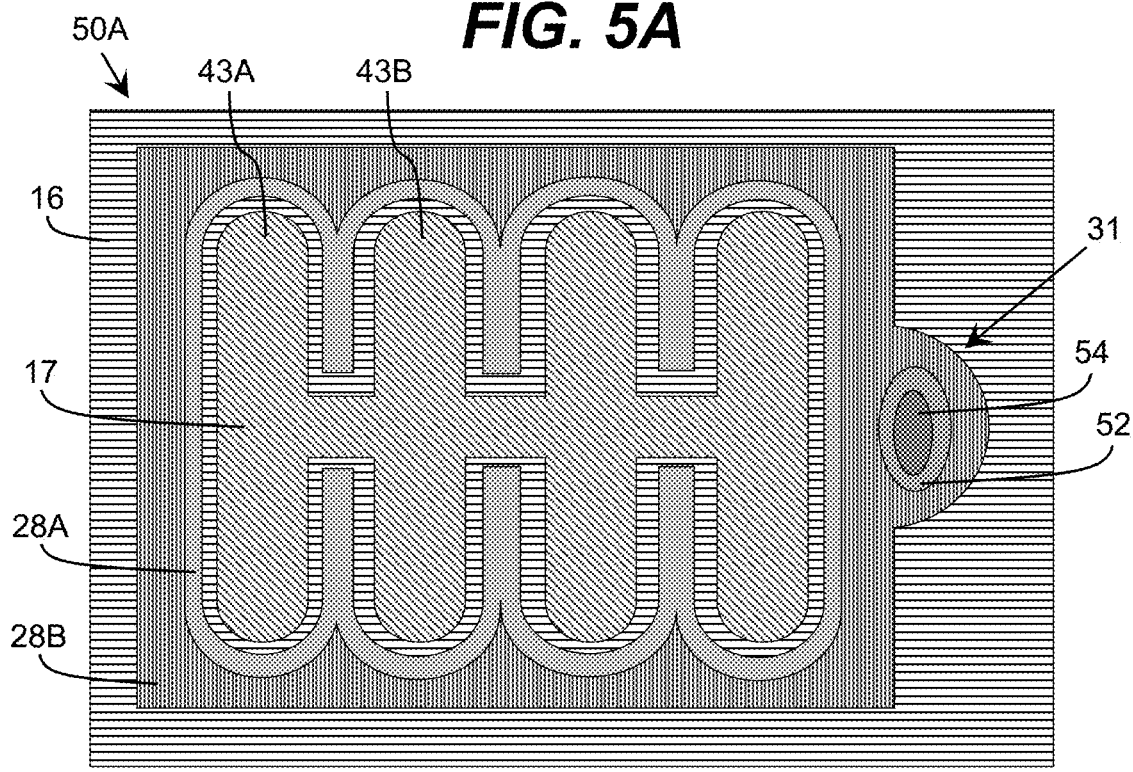
FIGS. 5A and 5B show illustrative devices including an interdigitated mesa and n-type contact according to embodiments.
Figure 5B:
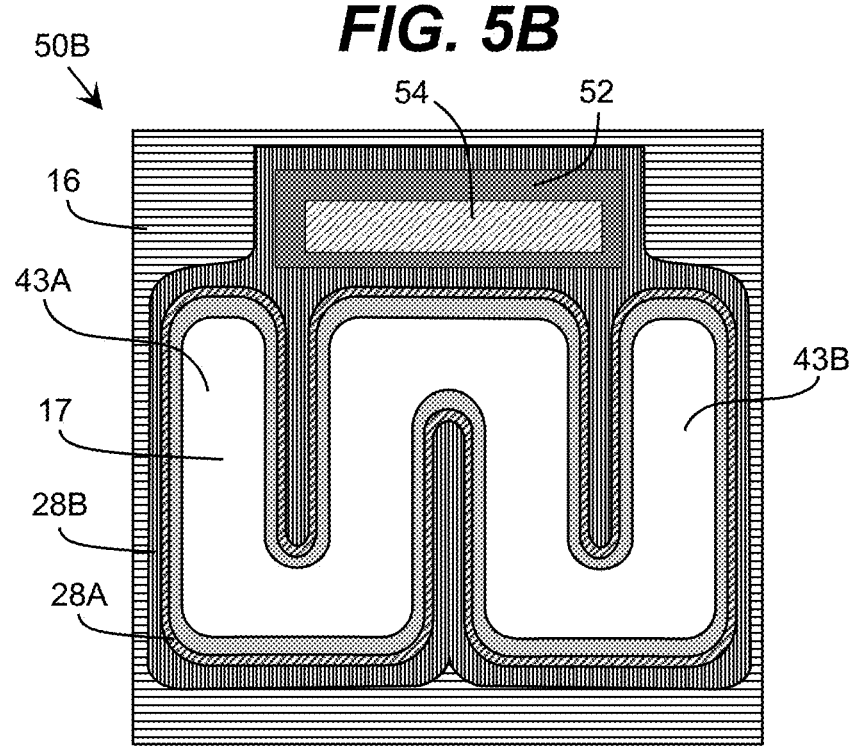

FIGS. 5A and 5B show top views of other embodiments of illustrative devices 50A, 50B, respectively. In each case, the n-type metallic contact includes two distinct metals. For example, a first metal 28A of the n-type metallic contact forms an interdigitated n-type metallic pattern in close proximity of the mesa 17, while a second metal 28B of the n-type metallic contact comprises a reflective metallic layer. The reflective metallic layer 28B can comprise any type of material reflective to the target radiation. For example, for an optoelectronic device configured to operate as an UV LED, the material can comprise a reflective metallic layer such as aluminum, rhodium, and/or the like. The two metals 28A, 28B are electrically connected. To this extent, the two metals 28A, 28B can be located immediately adjacent to each other on the n-type semiconductor layer 16 such that sidewalls of the respective layers are in contact. In an embodiment, one metal layer 28A, 28B can partially overlap the other metal layer 28A, 28B to ensure the electrical connection.

In an embodiment, the metal layers 28A, 28B are deposited using physical vapor deposition, sputtering and/or the like. For example, the metal layer 28A can be deposited first, followed by a high temperature annealing typical and known in the art for formation of an ohmic contact with the semiconductor layer 16. In an embodiment, the annealing can be done at temperatures in the range of 600-1000 C. The annealing time and temperature can be selected depending on the material of semiconductor layer 16, e.g., a group III nitride semiconductor layer. For instance, for an n-type contact layer 16 formed of $Al_{0.5}Ga_{0.5}N$, the annealing of the n-type ohmic contact 28A can comprise high temperature annealing (temperatures above 700 C). After annealing the metal layer 28A, the reflective metal layer 28B can be deposited with at least portion of the metal layer 28B overlapping the metal layer 28A, thereby forming an electrical contact.

In an embodiment, the reflective metal layer 28B can comprise a multilayered structure having at least two sub-layers with the first sub-layer being a highly reflective material and forming domains adjacent to portions of the n-type contact layer 16, with such domains not necessarily overlapping with regions of the n-type contact layer 16 on which the n-type ohmic contact layer 28A is located. The second sub-layer of the reflective metal layer 28B can comprise a contact protective layer overlapping with both layer 28A and the first sub-layer of the layer 28B. As used herein, a highly reflective layer can comprise a layer with at least 50% reflectivity to target radiation at the normal incidence.

Figure 6A:
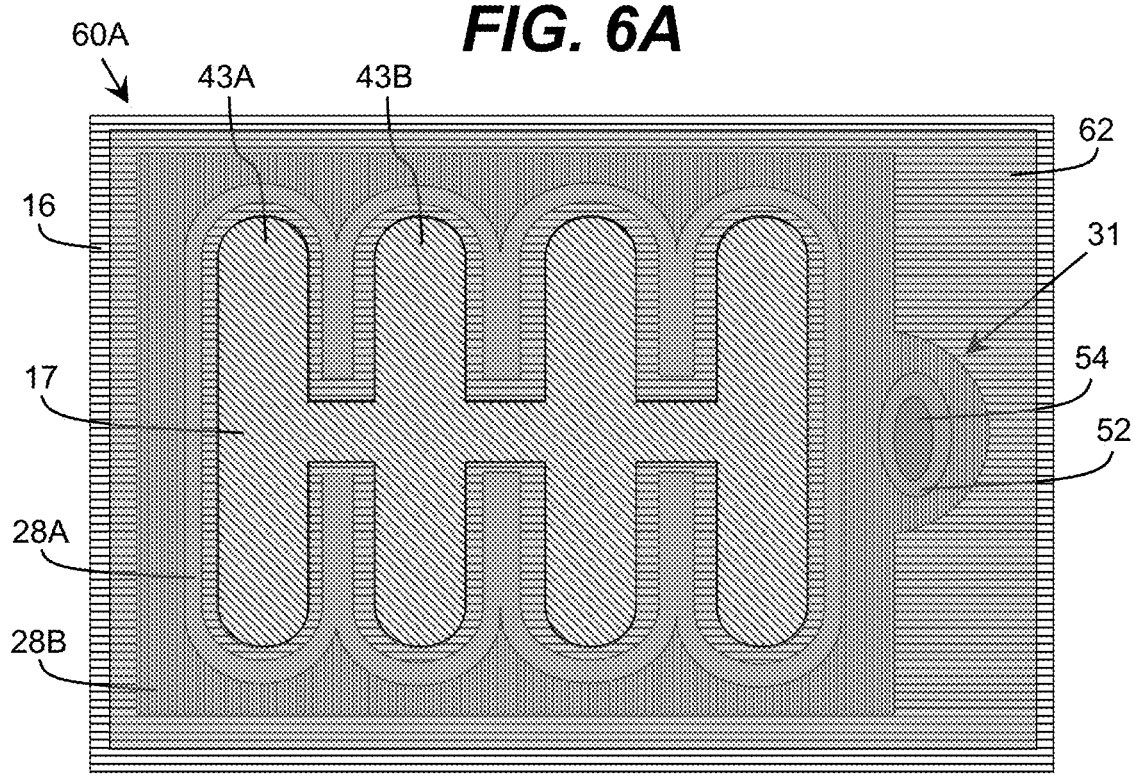
FIGS. 6A and 6B show illustrative devices including an interdigitated mesa and n-type contact that includes an additional layer according to embodiments.
Figure 6B:
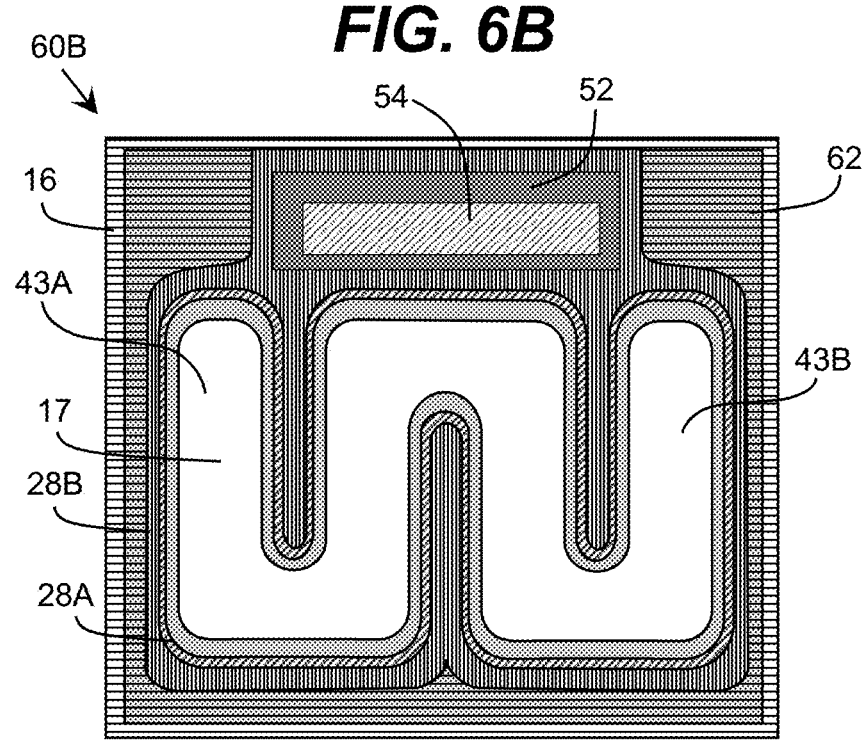

An n-type electrode pad 52 can be located on a portion of the reflective metallic contact 28B, and an n-type electrode 54 can be formed on the electrode pad 52. The electrode pad 52 can comprise an n-type metallic contact such as Ti/Al, Ti/Al/Au, and/or the like, whereas the n-type electrode 54 can comprise any contact with high electrical conductivity and having low oxidation. For example, the n-type electrode 54 can comprise Au. It is understood that one or more other layers can overlay some or all of the n-type metallic contact layer 28A and/or the reflective metallic layer 28B. To this extent, FIGS. 6A and 6B show top views of other embodiments of illustrative devices 60A, 60B. In this case, each device 60A, 60B includes a layer 62 that covers both of the metallic layers 28A, 28B, but does not cover the mesa 17. For example, both metal layers 28A, 28B can be protected with an overlying dielectric layer 62, which can comprise any suitable dielectric material including for example: $SiO_2$, AAO, $CaF_2$, $MgF_2$, and/or the like.

In an embodiment, the n-type layer 16 can be protected by a multilayered film forming an omnidirectional mirror. In this case, the layers adjacent to the n-type layer 16 can comprise dielectric layers described herein followed by the reflective metallic layers. For example, the layer 62 shown in FIGS. 6A and 6B, can comprise omnidirectional mirrors containing a low refractive index dielectric layer (wherein low is when compared to refractive index of the underlying semiconductor layer 16), deposited over the n-type semiconductor layer 16 followed by deposition of a reflective metallic layer. Alternatively, the layer 62 can comprise a Bragg reflector comprising alternating dielectric layers. In an embodiment, the layer 62 can include a Bragg reflector as a sub-layer with a metallic sub-layer deposited over the Bragg reflector sub-layer. The Bragg reflector can comprise $HfO_2$, $Al_2O_3$, and $SiO_2$ layers, as well as semiconductor layers. The layers can be either epitaxially grown or sputtered. While it is shown that the layer 62 is deposited over both the n-type metallic ohmic contact layer 28A and the reflective metallic contact layer 28B, it is understood that in an embodiment the n-type metallic contact layer 28A may not be present and the layer 62 can comprise a conducting layer having a multilayered structure. In this case, the layer 62 can be physically spaced from the mesa 17 as is shown in conjunction with the metallic contact layer 28A.

In an embodiment of a device described herein, substantially all open areas (e.g., except for a relatively small gap between n and p contacts) are covered with a highly reflective material, which can comprise, for example, a metallic reflective film. In an embodiment, such a metallic reflective film can further incorporate UV transparent plastics such as fluoropolymers, where it is understood that such plastics can be introduced after annealing of the device at high temperature. The introduction of such a reflective layer allows for the emitted light not to be absorbed by the submount metal.

An illustrative process of forming contacts and reflective layers for a device described herein can comprise the following: epitaxially growing a set of semiconductor layers forming the semiconductor heterostructure; and fabricating mesa regions by etching semiconductor layers exposing a portion of a surface of the n-type contact layer. The contacts can be formed by: depositing an n-type metallic ohmic contact over a first portion of the surface of the n-type contact layer, followed by contact annealing; and depositing the reflective contact over a second portion of the surface and optionally over an n-type metallic ohmic contact layer. Subsequently, the process can include depositing a protective dielectric layer over the areas covered by n-type metallic ohmic contact layer and reflective metallic contact layer, where the layer can comprise $SiO_2$, AAO, $CaF_2$, $MgF_2$, and/or the like. In an embodiment, the entire device can contain a dielectric layer deposited over the entire lateral area of the semiconductor layers including an area comprising a mesa region. In an embodiment, the deposition of the dielectric protective layer can be followed by deposition of a metallic reflective layer over the sides of the mesa region. Prior to deposition of the dielectric protective layer, the p-type metallic layer can be deposited over a top surface of the mesa region followed by p-type contact annealing. Access to the p-type metallic contact layer as well as the reflective or ohmic metallic contact layer can be achieved by etching a portion of the dielectric protective layer. The etching method can include photolithography, or masking prior to deposition of a dielectric material.

Figure 7A:
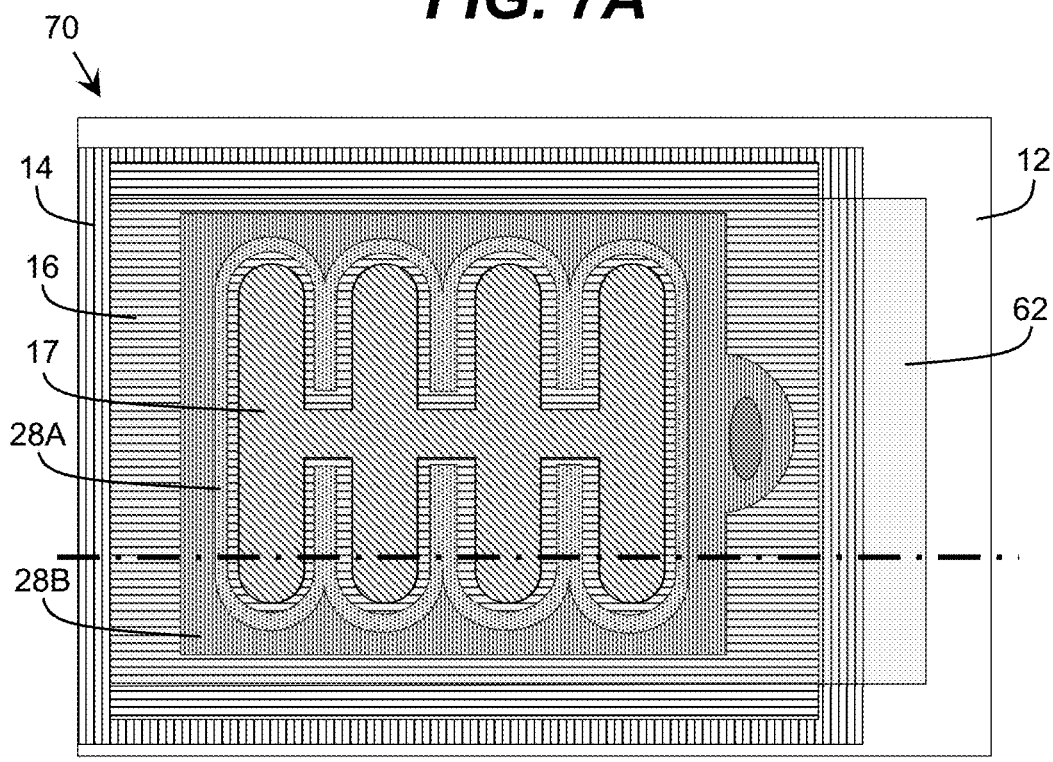
FIGS. 7A and 7B show top and cross section views of an illustrative optoelectronic device according to an embodiment and FIGS. 7C and 7D show top and cross section views of another illustrative optoelectronic device according to an embodiment.
Figure 7B:
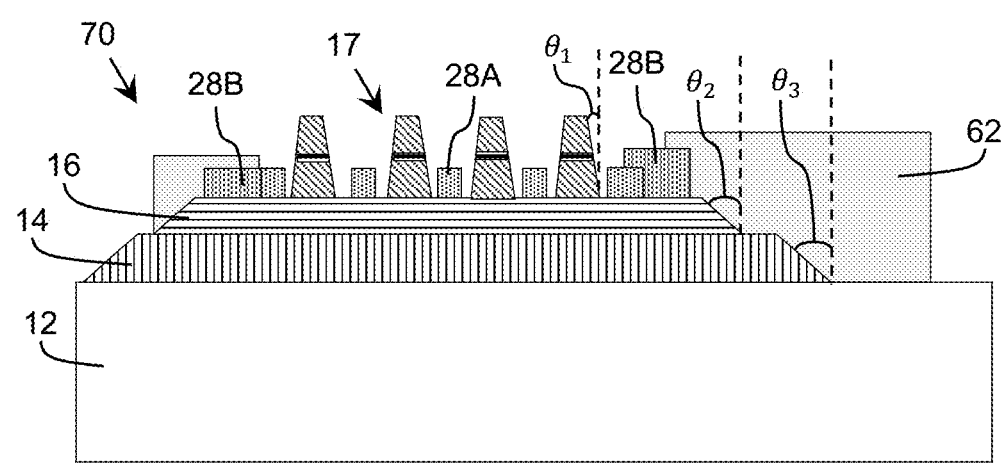
Figure 7C:
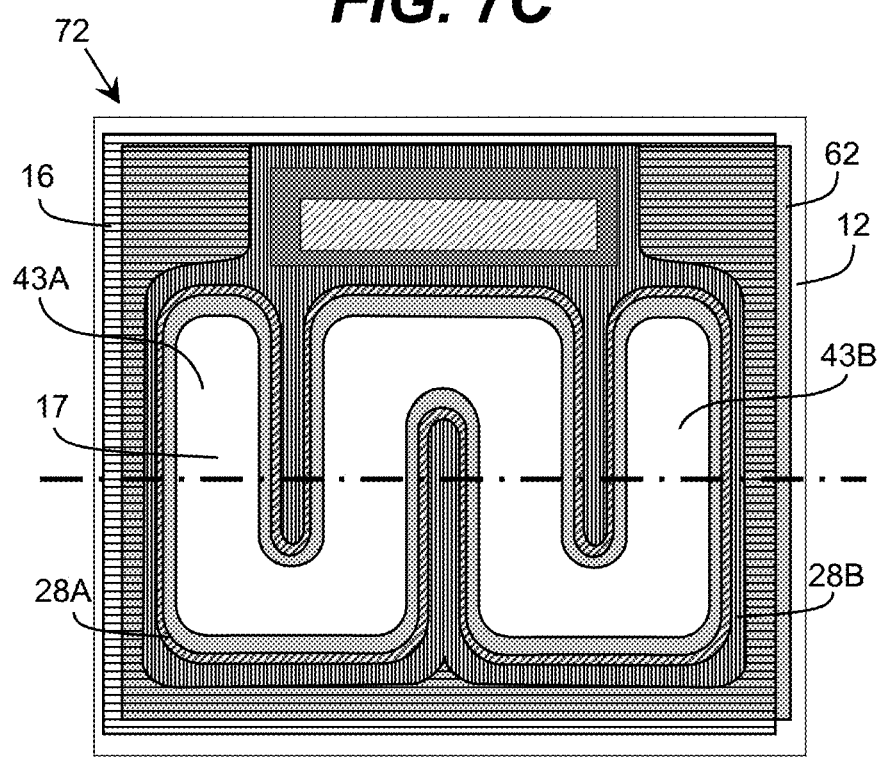
Figure 7D:
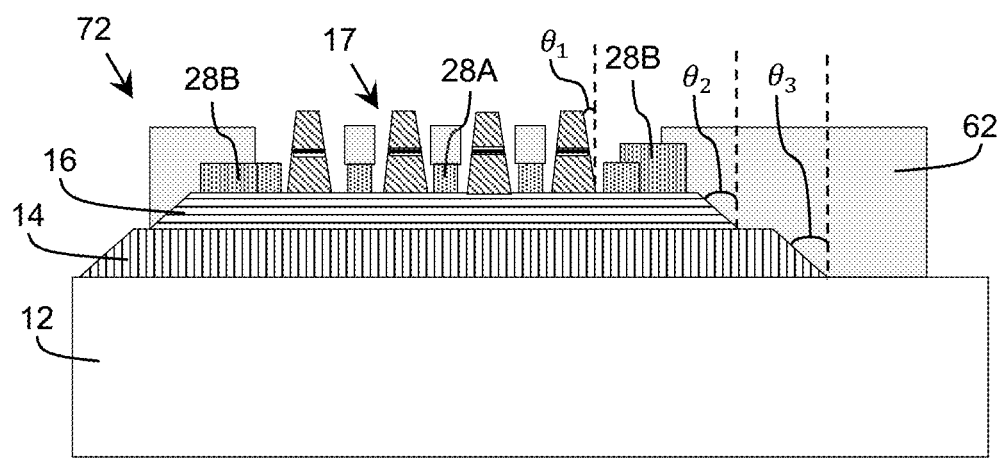

FIGS. 7A and 7B show top and side views, respectively, of an illustrative optoelectronic device 70 according to an embodiment, and FIGS. 7C and 7D show top and side views, respectively, of another optoelectronic device 72 according to an embodiment. In each case, the mesa region 17, the n-type layer 16, and the buffer layer 14, each have tapered structures as shown in FIGS. 7B and 7D. The layer 62 and the layer 28B can comprise a reflective metallic domain, and the layer 28A can be an n-type ohmic metallic contact layer. As seen in FIGS. 7B and 7D, the layer 28B can at least partially overlap the layer 28A (or vice versa) in one or more locations. The mesa region 17, the n-type contact layer 16, and the buffer layer 14 can comprise tapered structures with each structure having a tapering angle $\theta_1$, $\theta_2$, $\theta_3$, respectively. As used herein, a tapered structure comprises a semiconductor structure with a set of angled side surfaces (i.e., one or more side surfaces forming a non-zero angle with respect to a normal vector for the surface of the underlying layer as shown). In an embodiment, a tapering angle $\theta_1$, $\theta_2$, $\theta_3$ for at least a portion of each angled side surface in the set of angled side surfaces is between approximately ten and approximately eighty degrees. In an embodiment, the tapering angles $\theta_1$, $\theta_2$, $\theta_3$ are selected to increase (e.g., optimize) light extraction from the device 70, 72.

Figure 8:
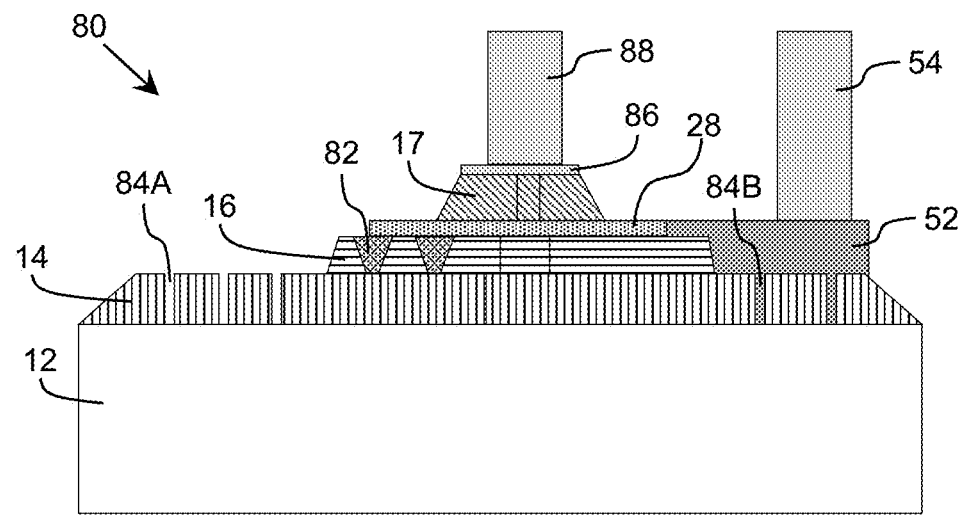
FIG. 8 shows a cross section of an illustrative optoelectronic device according to an embodiment.

FIG. 8 shows a side view of an illustrative optoelectronic device 80 according to an embodiment. In this case, the device 80 includes an n-type contact layer 16 containing scattering elements 82. For example, the scattering elements 82 can comprise voids within the layer 16. In an embodiment, the scattering elements 82 can be created through etching a pattern within the layer 16. In an illustrative embodiment, the scattering elements 82 comprise an array of voids, where the array can comprise a photonic crystal. Furthermore, the voids can be filled with reflective material and/or with a dielectric material, such as amorphous $Al_2O_3$, $SiO_2$, AAO, $CaF_2$, $MgF_2$, and/or the like. While not shown, it is understood that a metallic contact layer formed of a reflective metallic material can include at least one target radiation scattering domain.

It is understood that the n-type layer 16 can be etched prior to deposition of the n-type ohmic metallic contact layer 28 (and reflective metallic contact layer, when included). In an embodiment, a different etching process can be utilized for creating voids of several scales. For example, the n-type layer 16 can include voids of a first scale having a characteristic length-scale (e.g., an average lateral size) on the order of a micron, with voids of a second scale having a characteristic length-scale in the submicron (e.g., an order of magnitude smaller). Furthermore, it is understood that an exposed portion of the buffer layer 14 (e.g., a part of the buffer layer 14 not covered by n-type layer 26) can be further etched to contain voids/scattering elements 84A, 84B. As illustrated, some or all of these elements, such as vacancy 84B, can be subsequently filled with a material, such as a reflective metallic material 52 forming an n-type electrode pad, a dielectric material, and/or the like. In an embodiment, the optoelectronic device 80 comprises an n-type semiconductor layer 16 having a plurality of voids adjacent to a top surface of the semiconductor layer 16, with the voids having a depth of 0.1-50 microns and a lateral size of 0.1-20 microns. As also illustrated, the mesa 17 can include a p-type electrode pad 86 and a p-type electrode 88 formed thereon.

Figure 9:
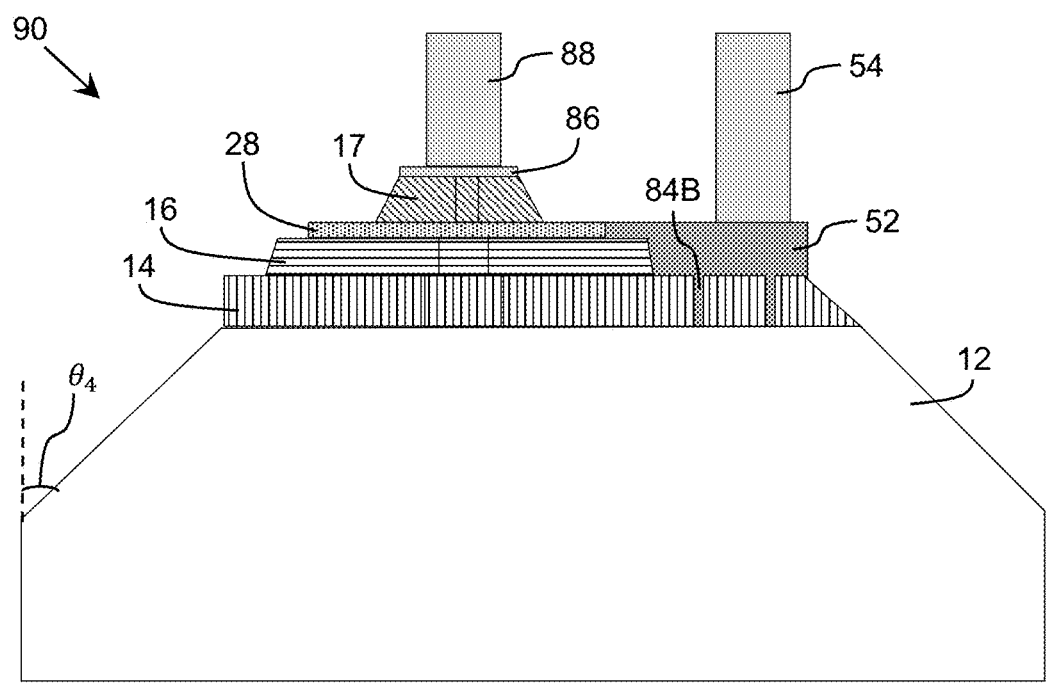
FIG. 9 shows a cross section of an illustrative optoelectronic device according to an embodiment.

FIG. 9 shows a cross section of an illustrative optoelectronic device 90 according to an embodiment. In this case, the device 90 includes a substrate 12 with one or more angled side surfaces. In particular, a side surface of the substrate 12 has a top portion that forms an angle $\theta_4$ with respect to a normal vector to a top surface of the substrate 12. The angle $\theta_4$ can be configured to increase (e.g., optimize) light extraction from the device 90.

FIGS. 10A-10D show cross sections of illustrative optoelectronic devices 100A-100D, respectively, according to embodiments. Each device 100A-100D includes an n-type metallic contact to the n-type layer 16, which is located over a dielectric layer 102 including voids. In embodiments illustrated by devices 100A, 100B, the n-type metallic contact includes a metallic layer 52 which is located over at least a portion of the dielectric layer 102. The metallic layer 52 penetrates the openings in the dielectric layer 102 and directly contacts the n-type layer 16 located below the dielectric layer 102. While not shown for clarity, it is understood that each optoelectronic device 100A, 100B can include one or more additional features as shown and described herein in conjunction with the other embodiments of the optoelectronic device. For example, the metallic contact layer 52A can include two or more metallic contact layers as described herein.

As illustrated, the metallic contact layer 52 and the dielectric layer 102 can contact a side surface of the mesa 17. In this case, the portion of the mesa 17 contacted by the metallic contact layer 52 can correspond to an n-type semiconductor layer, e.g., which can be the same layer/ material as the n-type layer 16. However, it is understood that this configuration is only illustrative and embodiments in which at least the n-type electrode pad 52 does not contact the mesa 17 are possible.

For example, as illustrated by the devices 100C, 100D, the metallic contact layers 52A, 52B can be physically separate from the mesa 17. A typical separation distance can be a few microns (e.g., 2-5 microns). As illustrated by the metallic contact layer 52B, some or all of the metallic contact layer 52B can be deposited directly on the surface of the n-type layer 16. Additionally, a reflective metallic layer 53 is shown deposited over and extending beyond one of the metallic contact layers 52A in order to promote light reflection from the contact region.

As further illustrated by the devices 100C, 100D, the metallic layers 52A, 52B can be embedded within the dielectric layer 102. In this case, the dielectric layer 102 can encapsulate the metallic layers 52A, 52B. As shown by the device 100D in FIG. 10D, an embodiment of a device 100D can include a dielectric layer 102 having a thickness configured to substantially align a top surface of the dielectric layer 102 with a top surface of the mesa 17. Subsequently, a metallic p-type contact layer 55 can be deposited over the mesa region 17, which can also extend over portions of the dielectric layer 102. Additionally, as shown in conjunction with the device 100D, the n-type layer 16 and/or the buffer layer 14 can comprise etched layers with the etching selected to form tapered semiconductor layers as described herein.

Figure 10C:
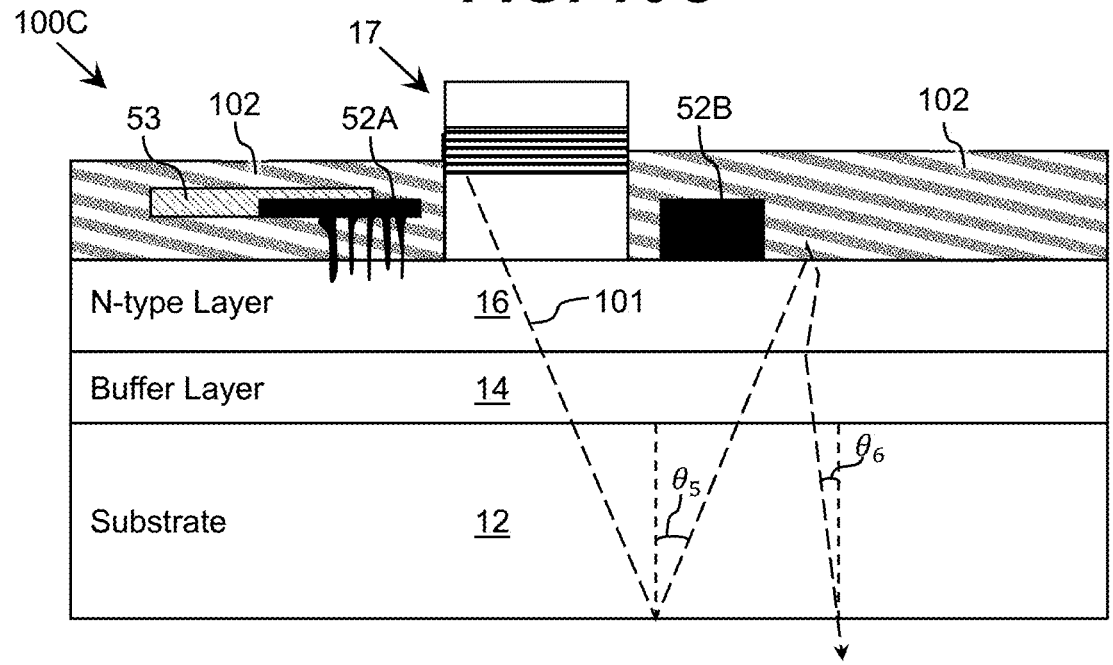
Figure 10D:
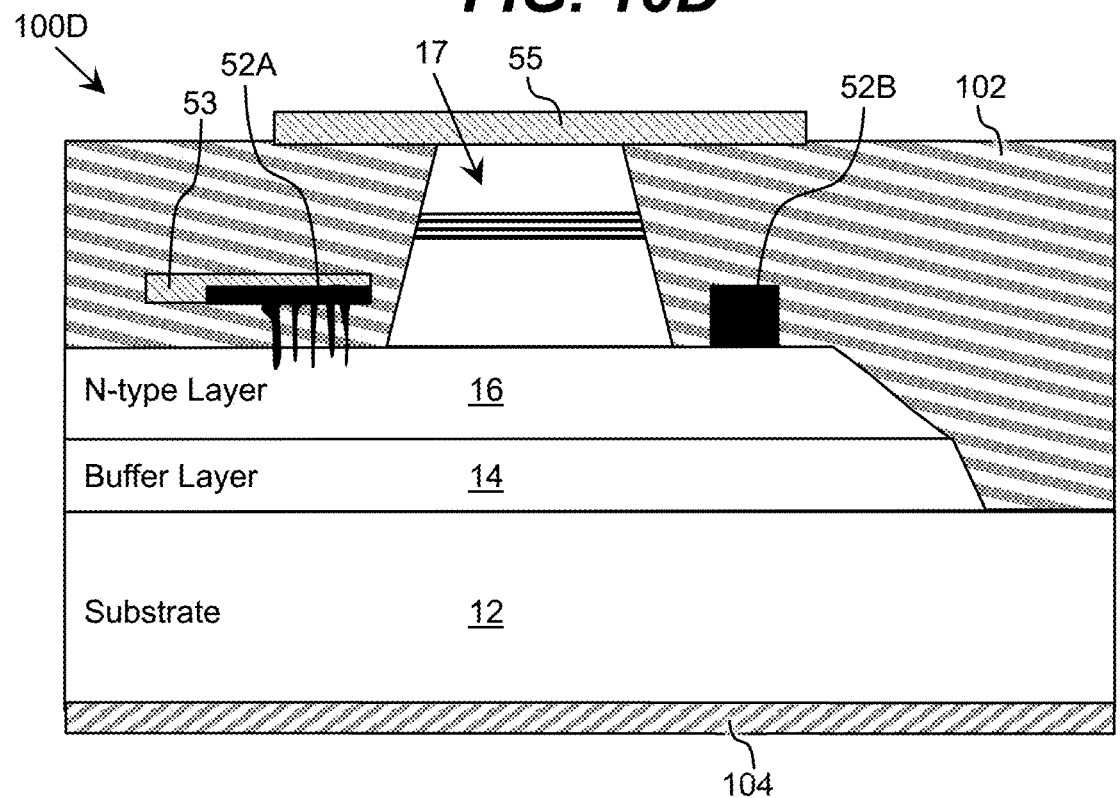

The dielectric layer 102 can be configured to reflect radiation at an angle that is different from the incident angle. To this extent, the dielectric layer 102 can have scattering properties. For example, as illustrated in FIGS. 10A and 10C, an emitted ray 101 can experience total internal reflection (TIR) with the exit surface (e.g., an interface of the substrate 12 with ambient) and have a reflection angle $\Theta_5$ (as measured relative to the surface normal) that is greater than the TIR angle. However, after interacting with the dielectric layer 102, the ray 101 can have an angle $\Theta_6$ that is smaller than the TIR angle, thereby allowing the ray 101 to exit the device 100A. As illustrated in FIGS. 10B and 10D, a device 100B, 100D also can include a dielectric layer 104 located on an exit surface of the device 100B, 100D, e.g., to act as an anti-reflective coating for the device 100B, 100D.

In an embodiment, the dielectric layer 102 and/or the dielectric layer 104 comprises a multi-layered structure, with each layer being transparent to the radiation corresponding to the device 100A-100D (e.g., radiation emitted by an active region of the device). For example, the dielectric layer 102, 104 can comprise a Bragg reflector with the Bragg reflector layers positioned at an angle to the interface between the dielectric layer 102, 104 and an adjacent layer (e.g., the n-type layer 16 for the dielectric layer 102 or the substrate 12 for the dielectric layer 104). The reflection from such a layer can result in an overall reorientation of the reflected ray 101.

Figure 11A:
FIGS. 11A-11D show illustrative configurations for dielectric layers according to embodiments.

It is understood that a device 100A-100D can include any combination of one or both dielectric layers 102, 104, each of which can have any of various configurations. To this extent, FIGS. 11A-11D show additional illustrative configurations for dielectric layers according to embodiments. In each case, the dielectric layer can be implemented as a dielectric layer 102 and/or as a dielectric layer 104 as shown in FIGS. 10A-10D. In FIG. 11A, the dielectric layer 106A includes two sub-layers 108A, 108B. For example, the sub-layer 108A can comprise a Bragg reflector with the Bragg reflector layers positioned at an angle to the interface between the sub-layer 108A and the sub-layer 108B. The sub-layer 108B can comprise a graded sub-layer 108B.

A dielectric layer 102, 104 described herein can be fabricated using any suitable dielectric material. Illustrative dielectric materials include silicon dioxide, hafnium dioxide, aluminum oxide, calcium fluoride, magnesium fluoride, and/or the like. In an embodiment, the dielectric materials used for the two sub-layers 108A include silicon dioxide alternating with hafnium dioxide. However, it is understood that this is only illustrative. In an embodiment, the dielectric layers are deposited using a sputtering technique, and are deposited at an angle to the surface normal.

Figure 11B:
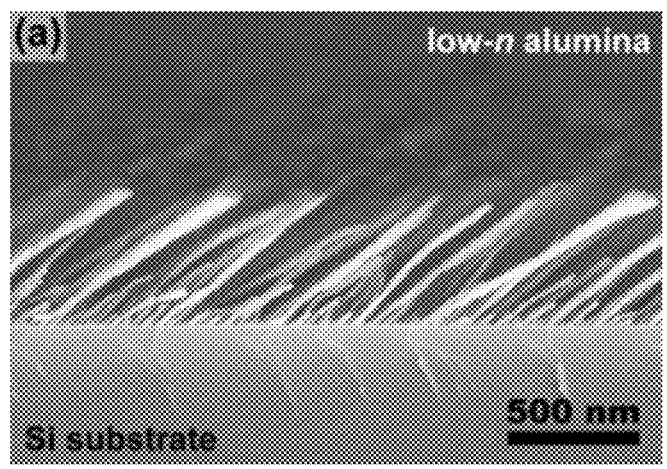
Figure 11B:
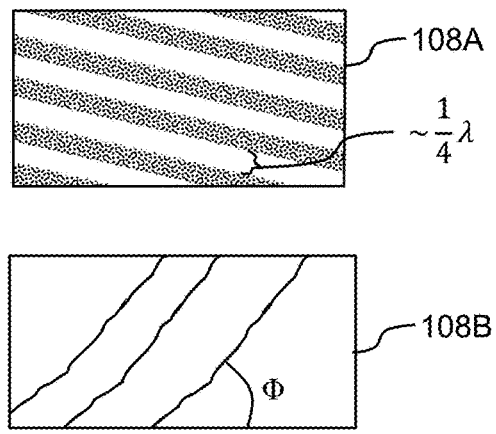

In an embodiment, the sub-layer 108B can comprise a nanostructured layer with nanostructures having a prolonged shape and inclined at an angle to the surface normal. In an embodiment, the nanostructures are formed from an ultraviolet transparent material such as, for example, silicon dioxide, hafnium dioxide, aluminum oxide, calcium fluoride, magnesium fluoride, and/or the like. For example, FIG. 11B shows an image illustrating nanostructures formed in a structure as well as illustrative attributes of the sub-layers 108A, 108B according to an embodiment. In an embodiment, the sub-layer 108B can have a height of approximately 500 nanometers, with nanostructures (e.g., nanorods) having an average inclination angle $\phi$ in a range between 40-65 degrees. The nanostructures can have an average width and spacing that is much smaller than the wavelength of the target radiation. For example, the width and/or spacing can be approximately ten times smaller than the wavelength of the target radiation (e.g., 15-40 nanometers).

The nanostructures can provide control over the index of refraction for the sub-layer 108B. For example, the nanostructures result in an averaged index of refraction, which can be altered by changing the size (width and/or length) and/or inclination angle of the nanostructures. Additionally, the sub-layer 108A can comprise variations of the index of refraction that are on the scale of approximately one quarter of the wavelength of the target radiation, which results in the sub-layer 108A forming an angled Bragg reflector or similar one dimensional periodic structures. However, it is understood that the sub-layer can include variations of the index of refraction that are comparable to or larger than the wavelength of the target radiation.

Figure 11C:
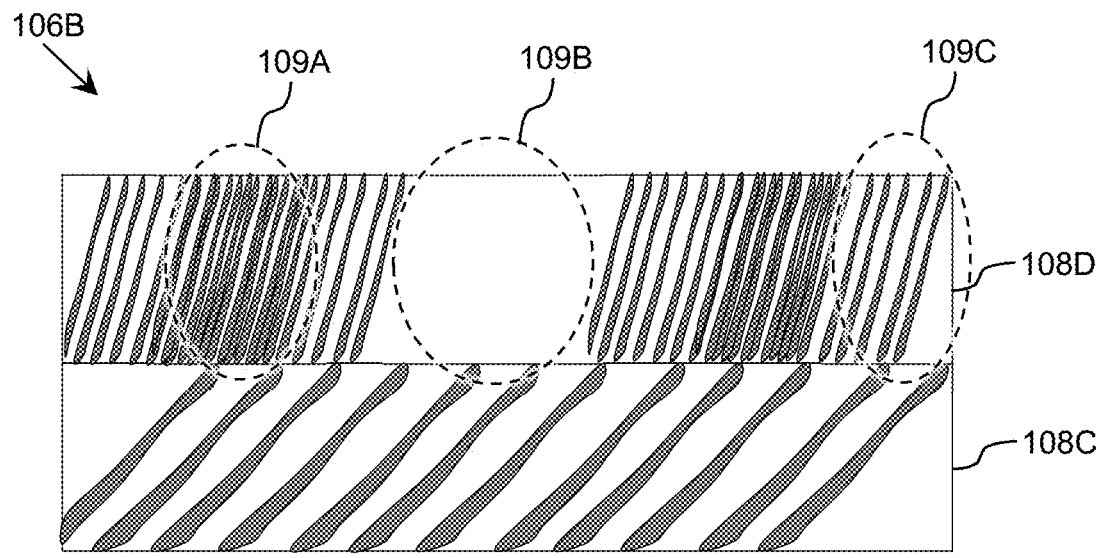

A dielectric layer described herein can include any number of one or more sub-layers having inclined nanostructures. Additionally, a sub-layer with inclined nanostructures can be configured to have a laterally variable index of refraction. Similarly, multiple sub-layers having nanostructures can have different attributes (e.g., nanostructure size, density, angles of inclination) to provide different indexes of refraction in a vertical direction. For example, FIG. 11C shows an illustrative dielectric layer 106B with two sub-layers 108C, 108D, each of which includes nanostructures. In sub-layer 108C, the nanostructures have substantially uniform sizes, angles of inclination, and density, thereby providing a substantially uniform angle of refraction for the sub-layer 108C in the lateral and vertical directions. In contrast, the sub-layer 108D has a highly non-uniform index of refraction in the lateral direction due to a lateral variation of the density of the nanostructures. In particular, the sub-layer 108D can include one or more domains 109A with a relatively high density of nanostructures as compared to other domains, one or more domains 109B with no nanostructures, and one or more domains 109C with a relatively low density of nanostructures as compared to other domains that include nanostructures. Such lateral variability in the index of refraction can allow a flat layer to act as a lens. The lateral variation can result from nanostructure variation over the surface.

Figure 11D:
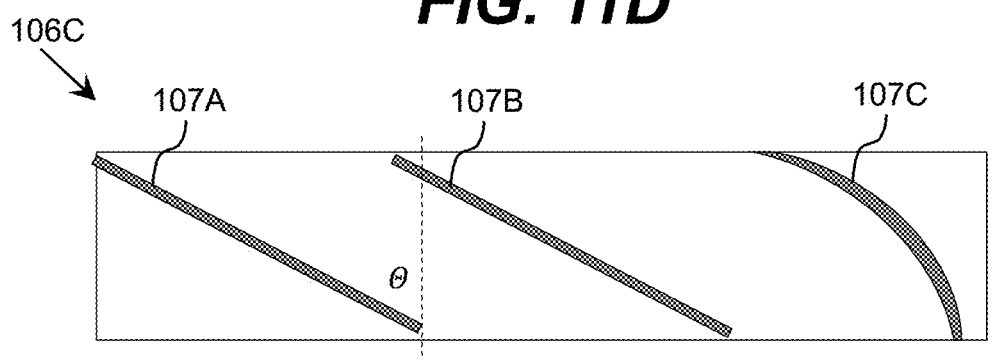

FIG. 11D shows still another illustrative configuration of a dielectric layer 106C according to an embodiment, in which individual Bragg reflective layers 107A-107C are incorporated therein. Each Bragg reflective layer is positioned at an angle $\Theta$ with respect to the normal to the surface. The Bragg reflective layers 107A-107C can include one or more Bragg reflective layers, such as the Bragg reflective layer 107C, having an irregular (e.g., curved) domain that can be controlled during the deposition process.

Incorporation of a reflective metallic layer, e.g., over an n-type metallic contact layer and/or over a dielectric layer, can serve as an ultraviolet blocking (protecting) layer. For example, such a layer can be partially reflective and partially absorbing to ensure that no UV radiation is emitted from a surface covered by the layer. In such an embodiment, the reflective layer serves as a protective layer to ensure that other components of the device are not exposed to UV radiation. In an embodiment, a protective layer can comprise an absorbing dielectric layer. In an embodiment, the protective layer is deposited over all the surfaces from which ultraviolet radiation is not desired to be emitted, thereby redirecting the ultraviolet radiation towards a radiating set of surfaces, such as substrate surfaces. In such cases, an epoxy, silicon, or similar material that can degrade under UV radiation can be utilized for an under fill layer during packaging and/or mounting of the UV LED die onto a printed board. An under fill layer can provide thermal management and/or mechanical strength for the device. The protective layer also can contribute to protecting top layers of printed boards once all UV radiation is reflected away from the printed board.

It is understood that devices described herein can be fabricated using a process that includes: epitaxially growing the semiconductor structure; etching one or more of the semiconductor layers; depositing one or more metallic layers; annealing; depositing dielectric layers; and attaching p-type and n-type electrodes to respective p-type and n-type metallic contact layers. In an embodiment, the fabrication can include: epitaxially growing a plurality of semiconductor layers over a surface of a substrate. The growing can comprise: growing a buffer layer over the substrate; growing an n-type semiconductor contact layer over the buffer layer; and growing an active semiconductor layer over the n-type semiconductor contact layer. Growing the active layer can comprise growing quantum wells and barriers, such as group III nitride semiconductor layers having different semiconductor alloy composition. Subsequently, the process can include: growing a p-type semiconductor contact layer over the active semiconductor layer; etching a first plurality of areas of at least the p-type semiconductor contact layer and the active semiconductor layer, thereby exposing a portion of the surface of the n-type semiconductor contact resulting in formation of a mesa over un-etched areas. The interface between the mesa and the exposed n-type semiconductor area can form a contact boundary. Subsequently, the process can include depositing a first n-type metallic ohmic contact region over a first portion of the exposed n-type semiconductor contact area in a proximity of the contact boundary.

The process can include one or more additional acts, which can include annealing a first n-type metallic ohmic contact layer, followed by depositing a second reflective metallic contact region over a second portion of the exposed n-type semiconductor contact area, where the first n-type metallic region and the second metallic contact region at least partially overlap. In an embodiment, prior to deposition of the first and the second metallic contact regions, the exposed n-type semiconductor area is etched to form a plurality of voids. In yet another embodiment, the fabrication of optoelectronic device can include etching the semiconductor heterostructure resulting in at least some semiconductor layers having a tapered structure.

While illustrative aspects of the invention have been shown and described herein primarily in conjunction with a heterostructure for an optoelectronic device and a method of fabricating such a heterostructure and/or device, it is understood that aspects of the invention further provide various alternative embodiments.

Figure 12:
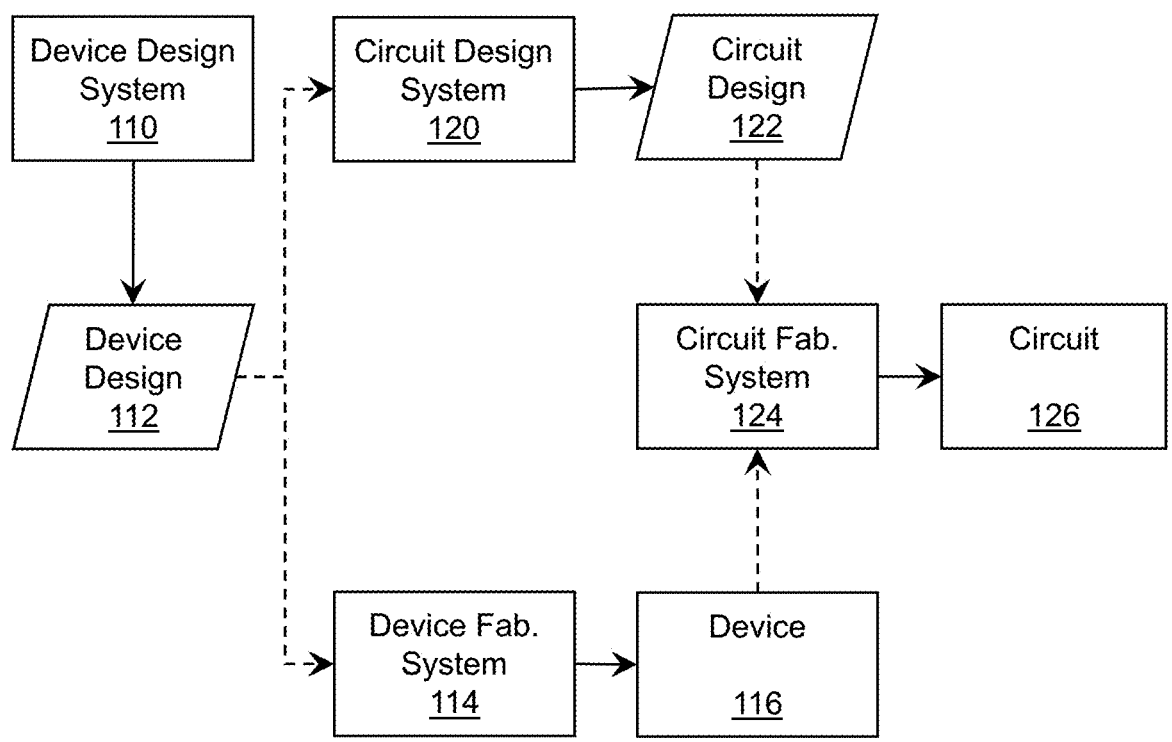
FIG. 12 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 12 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. An optoelectronic device comprising:
   an n-type semiconductor layer having a surface;
   a mesa located over a first portion of the surface of the n-type semiconductor layer and having a mesa boundary;
   an n-type contact region located over a second portion of the surface of the n-type semiconductor layer entirely distinct from the first portion, wherein the n-type contact region is at least partially defined by the mesa boundary;
   a first n-type metallic contact layer located over at least a portion of the n-type contact region in proximity of the mesa boundary, wherein the first n-type metallic contact layer forms an ohmic contact with the n-type semiconductor layer; and
   a second metallic contact layer located over a second portion of the n-type contact region, wherein the second metallic contact layer is formed of a reflective metallic material, wherein the first n-type metallic contact layer is formed of a first metal and the second metallic contact layer is formed of a second metal, wherein the first metal is distinct from the second metal, and wherein the n-type semiconductor layer includes at least one-scattering element.

2. The optoelectronic device of claim 1, wherein the first n-type metallic contact layer and the second metallic contact layer at least partially overlap.

3. The optoelectronic device of claim 1, wherein a third metallic contact layer is located over at least a portion of the first n-type metallic contact layer and at least a portion of the second metallic contact layer.

4. The optoelectronic device of claim 1, wherein the n-type semiconductor layer comprises a group III nitride semiconductor.

5. The optoelectronic device of claim 1, wherein the first n-type metallic contact layer comprises a plurality of domains with each domain having a smallest characteristic length-scale being at least a current spreading length width of the n-type semiconductor contact layer.

6. The optoelectronic device of claim 1, further comprising a dielectric layer located between at least a portion of the n-type contact region and the first n-type metallic contact layer, wherein the dielectric layer includes a plurality of voids extending there through, and wherein the first n-type metallic contact layer penetrates the plurality of voids and directly contacts the at least the portion of the n-type contact region.

7. The optoelectronic device of claim 1, wherein the at least one scattering element includes a plurality of voids, each of the plurality of voids having a depth of 0.1-50 microns and a lateral size of 0.1-20 microns.

8. The optoelectronic device of claim 7, wherein at least a portion of the plurality of voids are at least partially filled with target radiation scattering material.

9. The optoelectronic device of claim 7, wherein at least one of: the first n-type metallic contact layer or the second n-type metallic contact layer, fills at least a portion of the plurality of voids.

10. The optoelectronic device of claim 1, wherein the n-type semiconductor layer comprises a set of angled side surfaces, wherein at least a portion of each angled side surface in the set of angled side surfaces forms an angle between approximately ten and approximately eighty degrees with a normal vector to a top surface of the n-type semiconductor contact layer.

11. The optoelectronic device of claim 1, wherein the mesa comprises a set of angled side surfaces, wherein at least a portion of each angled side surface in the set of angled side surfaces forms an angle between approximately ten and approximately eighty degrees with a normal vector of a top surface of the mesa.

12. The optoelectronic device of claim 1, further comprising:
   a substrate; and
   a buffer layer located over the substrate, wherein the n-type semiconductor layer is located over the buffer layer.

13. The optoelectronic device of claim 12, wherein a surface area of a top surface of the n-type semiconductor layer is at least 5% smaller than a surface area of a top surface of the buffer layer.

14. The optoelectronic device of claim 12, wherein a surface area of a top surface of the buffer layer is at least 5% smaller than a surface area of the top surface of the substrate.

15. The optoelectronic device of claim 12, wherein the buffer layer comprises a set of angled side surfaces, wherein at least a portion of each angled side surface in the set of angled side surfaces forms an angle between approximately ten and approximately eighty degrees with a normal vector of a top surface of the buffer layer.

16. The optoelectronic device of claim 1, wherein the mesa boundary includes a plurality of interconnected fingers, and wherein the first n-type metallic contact layer extends between the plurality of interconnected fingers.

17. A method of fabricating an optoelectronic device comprising:
   forming a mesa having a mesa boundary over a first portion of an n-type semiconductor layer, wherein the mesa includes an active semiconductor layer and a p-type semiconductor contact layer located on an opposite side of the active semiconductor layer as the n-type semiconductor layer, and wherein the n-type semiconductor layer has an n-type contact region located over a second portion of the surface of the n-type semiconductor contact layer entirely distinct from the first portion, wherein the n-type contact region is at least partially defined by the mesa boundary;
   forming at least one scattering element in the n-type semiconductor layer;
   depositing a first n-type metallic contact layer over a first portion of the n-type contact region in proximity to the mesa boundary; and
   depositing a second n-type metallic contact layer over a second portion of the n-type contact region, wherein the first n-type metallic contact layer is formed of a first metal and the second metallic contact layer is formed of a second metal, wherein the first metal is distinct from the second metal.

18. The method of claim 17, wherein the first n-type metallic region and the second n-type metallic contact region at least partially overlap.

19. The method of claim 17, wherein the forming at least one scattering element includes, prior to deposition of the first and the second n-type metallic contact layers, etching the n-type contact region to form a plurality of voids, wherein the plurality of voids have a depth of 0.1-50 microns and a lateral size of 0.1-20 microns.

* * * * *